(12) United States Patent
Meguro et al.

(10) Patent No.: US 7,400,137 B1
(45) Date of Patent: Jul. 15, 2008

(54) MAGNETIC ENCODER HAVING A STABLE OUTPUT PROPERTY WITH UNSATURATED MAGNETIC SENSOR

(75) Inventors: Kenichi Meguro, Kaisei (JP); Hiroyuki Hoshiya, Odawara (JP); Kazuhiro Nakamoto, Ninomiya (JP); Yasuyuki Okada, Tokyo (JP); Yasunori Abe, Moka (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/834,062

(22) Filed: Aug. 6, 2007

(30) Foreign Application Priority Data

Jan. 31, 2007 (JP) .............................. 2007-021372

(51) Int. Cl.
*G01R 33/09* (2006.01)
*H01L 43/08* (2006.01)
*G01B 7/14* (2006.01)
*G01B 7/30* (2006.01)

(52) U.S. Cl. ..................... 324/207.21; 324/207.24; 324/207.25; 324/249; 324/252

(58) Field of Classification Search ............ 324/207.21, 324/207.24–207.26, 244, 249, 252, 260; 365/158; 360/314–316, 324–327; 428/692.1, 428/693.1

See application file for complete search history.

(56) References Cited

U.S. PATENT DOCUMENTS

| 5,561,368 A | 10/1996 | Dovek et al. |
| 5,637,392 A | 6/1997 | Sakakima et al. |
| 2002/0039266 A1 | 4/2002 | Saito et al. |

FOREIGN PATENT DOCUMENTS

| JP | 2812042 | 8/1998 |
| JP | 3017061 | 12/1999 |
| JP | 3040750 | 3/2000 |

*Primary Examiner*—Bot LeDynh
(74) *Attorney, Agent, or Firm*—Antonelli, Terry, Stout & Kraus, LLP.

(57) ABSTRACT

The present invention provides a magnetic sensor suitable for high resolution and having high reliability by achieving stable output even at the occurrence of variations in a gap between a magnetic medium and the magnetic sensor, and a magnetic encoder using the magnetic sensor. The present invention uses a magnetoresistive element having magnetoresistive properties that satisfy the inequation, $H10-50 < H50-90$, where $H10-50$ represents a magnetic field required for a resistance change from $\Delta R \times 10\%$ to $\Delta R \times 50\%$ with respect to a maximum amount of resistance change $\Delta R$ on a magnetoresistance effect curve, and $H50-90$ represents a magnetic field required for a resistance change from $\Delta R \times 50\%$ to $\Delta R \times 90\%$.

13 Claims, 14 Drawing Sheets

21,22,23,24

MAGNETIC ENCODER HAVING A STABLE OUTPUT PROPERTY WITH UNSATURATED MAGNETIC SENSOR

CLAIM OF PRIORITY

The present application claims priority from Japanese application JP 2007-021372 filed on Jan. 31, 2007, the content of which is hereby incorporated by reference into this application.

BACKGROUND OF THE INVENTION

1. Technical Field

The present invention relates to a magnetic sensor having a Spin-valve type giant magnetoresistive element and a magnetic encoder using the same.

2. Background Art

Recently, there have been strong demands that a magnetic encoder for use in consumer electronics equipment such as a digital still camera and an ink jet printer achieves high resolution and low power consumption in addition to small size and low price.

Heretofore, an anisotropic magnetoresitance effect (hereinafter referred to simply as "AMR") film made of a NiFe (nickel-iron) alloy film or the like has been used for a magnetic sensor to be mounted to the magnetic encoder. The AMR effect is a phenomenon in which electrical resistance changes according to a relative angle between the direction of current passing through a ferromagnetic film of a NiFe alloy or the like and the direction of magnetization of the ferromagnetic film. By utilizing the phenomenon, a change in resistance of an element according to an externally applied signal magnetic field can be outputted through a change in voltage or current. Specifically, when an AMR element is disposed as separated by a predetermined gap from a magnetic medium magnetized in alternating multipolar form as illustrated schematically in FIG. 1, a change in output according to a periodic signal magnetic field originating from the magnetic medium can be detected.

High resolution of the magnetic encoder can be achieved by narrowing a magnetized pitch (or a length of a pair of the north and south poles) of the magnetic medium and correspondingly narrowing a pattern width of the magnetic sensor. However, it is required that the magnetic sensor be of high sensitivity because the narrowing of the magnetized pitch of the magnetic medium leads to a decrease in the signal magnetic field from the surface of the magnetic medium. Although an AMR film of NiFe or the like undergoes a change in electrical resistance under a signal magnetic field of relatively small magnitude, magnetoresistive ratio (hereinafter referred to simply as "MR ratio") is of the order of a few percent, which is not necessarily high. Thus, the sensitivity can possibly be insufficient for the magnetic encoder to achieve high resolution. Generally, the AMR film has a thickness of about 20 nm. Thus, the narrowing of the pattern width of the magnetic sensor corresponding to the magnetized pitch of the magnetic medium leads to shape anisotropy, which can possibly cause an increase in an anisotropy field and hence a reduction in the sensitivity to magnetic field. Moreover, the thick AMR film means that the resistance of the element is relatively low, and therefore the AMR film has a problem also from the viewpoint of power consumption.

Other magnetic sensors include an element utilizing an antiferro-coupled giant magnetoresistive (hereinafter referred to simply as "coupled GMR") film, as disclosed in Japanese Patent No. 2812042. The coupled GMR film is formed of a multilayer superlattice film having ferromagnetic layers and non-magnetic layers alternating with each other, which are stacked one on top of another in a few layers to a few tens of layers. Antiferromagnetic interlayer coupling (or interaction such that the magnetization directions of adjacent ferromagnetic layers are antiparallel to each other) occurs between the adjacent ferromagnetic layers with the non-magnetic layer in between. In the GMR film, an electrical resistance changes according to a relative angle between the magnetization directions of the adjacent ferromagnetic layers with the non-magnetic layer in between. More specifically, under no external magnetic field, the magnetizations of the adjacent ferromagnetic layers are antiparallel to each other, and the resistance is maximized. On the other hand, under an external magnetic field, the magnetizations of the adjacent ferromagnetic layers are parallel to each other, and the resistance is minimized. The MR ratio of the coupled GMR film is a few times higher than that of the AMR film, and therefore the coupled GMR film is advantageous in terms of high output. However, a transition of the magnetizations of the adjacent ferromagnetic layers from an antiparallel state to a parallel state requires a magnetic field of such great magnitude that overcomes the antiferromagnetic interlayer coupling between the ferromagnetic layers with the non-magnetic layer in between. The coupled GMR film, in an aspect, cannot be said to be suitable for use in the magnetic encoder for detection of a signal magnetic field of relatively small magnitude. Moreover, the coupled GMR film has difficulty in achieving low power consumption because of having a thick sensor film and hence a low element resistance, as in the case of the AMR film.

Japanese Patent No. 3040750 discloses a Spin-valve type GMR film in use as a magnetic read head for a hard disk drive, as a magnetic sensor film that responds to a signal magnetic field of relatively small magnitude and exhibits a high MR ratio which is about the same as that of the coupled GMR film. The Spin-valve type GMR film is configured basically of a ferromagnetic pinned layer, a non-magnetic intermediate layer, and a ferromagnetic free layer. The direction of magnetization of the ferromagnetic pinned layer is unidirectionally pinned by an antiferromagnetic layer, which is formed adjacent to the ferromagnetic pinned layer to impart unidirectional magnetic anisotropy to the ferromagnetic pinned layer and do the like. On the other hand, the ferromagnetic free layer changes the direction of magnetization according to an external magnetic field. Thus, the Spin-valve type GMR film enables the transition of the magnetizations of the two ferromagnetic layers with the non-magnetic intermediate layer in between from the antiparallel state to the parallel state, under a magnetic field of relatively small magnitude. Moreover, the Spin-valve type GMR film has electrical resistance a few times higher than that of the coupled GMR film, and therefore the Spin-valve type GMR film is advantageous also in terms of low power consumption. A bridge circuit magnetic sensor using a Spin-valve type GMR element is disclosed in Japanese Patent No. 3017061.

SUMMARY OF THE INVENTION

However, the use of the Spin-valve type GMR element in place of the AMR element or the coupled GMR element has the problem of reducing resolution by half. As is apparent from a magnetoresitance effect curve shown in FIG. 2A, the AMR element undergoes symmetrical resistance change in the positive and negative directions of an external magnetic field (incidentally, the same goes for the coupled GMR element). In other words, these elements output resistance changes according to an increase or decrease in the magnitude of a signal magnetic field, regardless of the direction of the signal magnetic field. Thus, an output from the magnetic sensor (or a resistance change of the element) is obtained with a period λ equal to the magnetized pitch λ of the magnetic medium. On the other hand, the Spin-valve type GMR element has an asymmetrical magnetoresitance effect curve in the positive and negative directions of the external magnetic field, as shown in FIG. 2B. Thus, the output from the magnetic sensor (or the resistance change of the element) is obtained with a period 2λ relative to the magnetized pitch λ of the magnetic medium. FIG. 3 shows a difference between output changes of the AMR element and the Spin-valve type GMR element relative to the magnetized pitch of the magnetic medium as mentioned above. To use the Spin-valve type GMR element as the magnetic sensor for a high-resolution magnetic encoder, it is therefore essential that the Spin-valve type GMR element be contrived to have magnetoresistive properties such as are exhibited by the AMR element or the coupled GMR element. Specifically, this is accomplished by a superposition of the magnetoresistive properties of two Spin-valve type GMR elements having the magnetoresistive properties of having opposite phases.

However, this superposition has difficulty in achieving sufficiently high output because it can possibly cause unintentional output setoff. Moreover, a decrease in output due to the output setoff depends greatly on a magnetic gap between the magnetic sensor and the magnetic medium. In the magnetic encoder, the magnetic gap has some fluctuations. It can be therefore said that desirable properties are that the magnetic sensor undergoes no output change even at the occurrence of variations in the magnetic gap. Basically, larger magnetic gap leads to greater attenuation of the signal magnetic field from the magnetic medium and hence to lower output from the magnetic sensor. It is therefore necessary to control the magnetic gap so as to avoid an excessively large magnetic gap in order to ensure a required output level. On the other hand, in process of a series of examinations, it has been shown that too narrow a magnetic gap also causes a decrease in the output from the magnetic sensor. In other words, the prior art has difficulty in achieving the magnetic encoder suitable for high resolution and also having high reliability, because of being incapable of achieving stable high output at the occurrence of fluctuations in the magnetic gap between the magnetic sensor and the magnetic medium.

An object of the present invention is therefore to provide a magnetic encoder having high resolution and having high reliability with little change in output even at the occurrence of variations in the magnetic gap between the magnetic sensor and the magnetic medium.

To fabricate a magnetic encoder configured of a magnetic medium periodically magnetized and a magnetic sensor formed of plural magnetoresistive elements, each using a Spin-valve type GMR film, the present invention uses the magnetoresistive element that exhibits a characteristic response for magnetic field. Generally, the magnetoresistive element is often desired to have linear magnetic parametric performance for signal magnetic field. However, the present invention fabricates and uses the magnetoresistive element having nonlinear magnetoresistive properties for signal magnetic field. Specifically, the present invention uses the magnetoresistive element that satisfies the equation, $H10-50 < H50-90$, where $H10-50$ represents a magnetic field required for a resistance change from $\Delta R \times 10\%$ to $\Delta R \times 50\%$ with respect to a maximum amount of resistance change (hereinafter referred to simply as "$\Delta R$") in process of a resistance change occurring according to an external magnetic field parallel to the direction of magnetization of the ferromagnetic pinned layer, and $H50-90$ represents a magnetic field required for a resistance change from $\Delta R \times 50\%$ to $\Delta R \times 90\%$. In other words, the magnetoresistive element for use in the present invention has high sensitivity in a changing region where the amount of resistance change increases from $\Delta R \times 10\%$ to $\Delta R \times 50\%$ in process of a transition of the amount of resistance change from zero to $\Delta R$, and has low sensitivity in a changing region where the amount thereof increases from $\Delta R \times 50\%$ to $\Delta R \times 90\%$. Preferably, the present invention uses the magnetoresistive element that satisfies the equation, $1.5 < H50-90/H10-50 < 4.0$. This enables suppressing the unintentional output setoff involved in the superposition of outputs. Moreover, the suppression of the output setoff involved in the superposition of outputs enables achieving stable output characteristics, even at the occurrence of variations in the magnetic gap between the magnetic sensor and the magnetic medium.

The characteristic magnetoresistive properties as mentioned above are accomplished by the following configuration: the non-magnetic intermediate layer has a locally non-uniform distribution of layer thickness, and the magnitude of ferromagnetic interlayer coupling between the ferromagnetic pinned layer and the ferromagnetic free layer with the non-magnetic intermediate layer in between is locally nonuniform.

Used as other means for achieving the characteristic magnetoresistive properties is a method that involves performing annealing treatment under magnetic field so that the average magnetization direction of the ferromagnetic pinned layer can deviate from the magnetized direction of the magnetic medium within a range of angles of 30 degrees or less.

The present invention enables achieving a magnetic encoder capable of achieving stable output, suitable for high resolution, and having high reliability, even at the occurrence of variations in the magnetic gap between the magnetic medium and the magnetic sensor.

Figure 1:
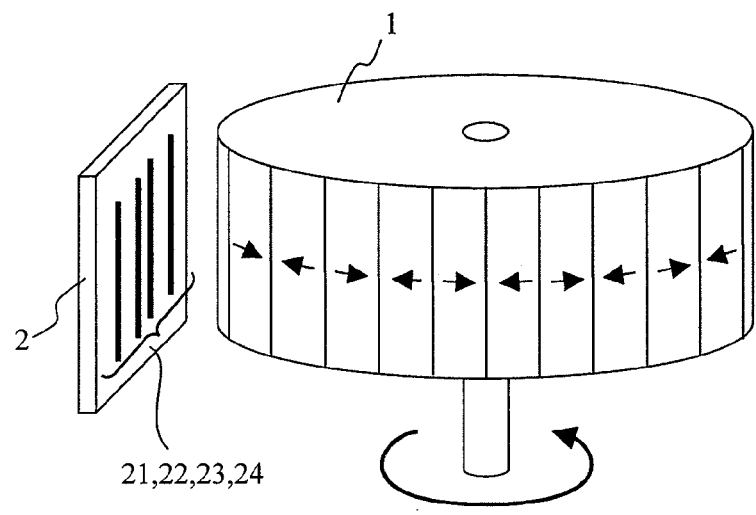
FIG. 1 is a schematic illustration of the configuration of a magnetic encoder according to the present invention.

DESCRIPTION OF THE PREFERRED
EMBODIMENTS OF THE INVENTION

Embodiments of the present invention will be described below with reference to the accompanying drawings. In order to simplify an understanding of the embodiments of the present invention, the same or similar functional parts in the several figures will be given the same reference numerals.

First Embodiment

FIG. 1 illustrates, in schematic form, the configuration of a magnetic encoder according to the present invention. The magnetic encoder includes a magnetic medium 1, and a magnetic sensor 2 that moves relative to the magnetic medium 1, facing the magnetic medium 1 with a predetermined gap in between, and the magnetic medium 1 is magnetized in alternating multipolar form in the direction of relative movement thereof with respect to the magnetic sensor 2.

Figure 4:
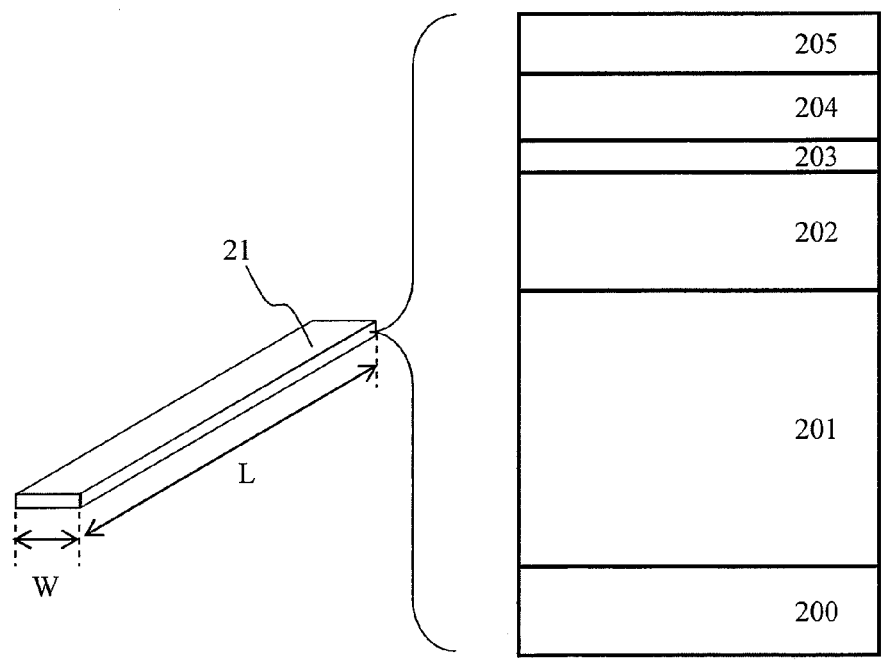
FIG. 4 is a schematic illustration of the configuration of a magnetoresistive element using a Spin-valve type GMR film.

The magnetic sensor 2 includes a magnetoresistive element 21 using at least a Spin-valve type GMR film. FIG. 4 illustrates, in schematic form, the configuration of the magnetoresistive element 21. The Spin-valve type GMR film that constitutes the magnetoresistive element 21 has a multilayer structure including at least a ferromagnetic pinned layer 202, a non-magnetic intermediate layer 203, and a ferromagnetic free layer 204, which are stacked one on top of another. Furthermore, an antiferromagnetic layer 201 may be formed in contact with the ferromagnetic pinned layer 202 and on the opposite side to the non-magnetic intermediate layer 203 in order to unidirectionally pin the direction of magnetization of the ferromagnetic pinned layer 202. Of course, a seed layer 200 and a cap layer 205 may be appropriately formed as bottommost and topmost layers, respectively. DC magnetron sputtering equipment was used to form the Spin-valve type GMR film, from the viewpoint of stability and efficiency of mass production.

The Spin-valve type GMR film is configured, for example, of a substrate: the seed layer made of Ta (tantalum) of 2.5 nm thick, a NiFeCr (nickel-iron-chromium) alloy of 3.2 nm thick, and NiFe of 0.8 nm thick; the antiferromagnetic layer made of a MnPt (manganese-platinum) alloy of 14 nm thick; the ferromagnetic pinned layer made of a CoFe (cobalt-iron) alloy of 1.8 nm thick, Ru (ruthenium) of 0.8 nm thick, and CoFe of 2.2 nm thick; the non-magnetic intermediate layer made of Cu (copper) of 2.3 nm thick; the ferromagnetic free layer made of CoFe of 1 nm thick and NiFe of 3 nm thick; and the cap layer made of Cu of 0.6 nm thick and Ta of 3 nm thick, which are formed, as laid one on top of another, on top of the substrate. Although MnPt was used for the antiferromagnetic layer as given as an example, a material represented as Mn—X, such as a MnIr (manganese-iridium) alloy or MnRu, may be used for the antiferromagnetic layer (where X denotes at least one of Ru, Rh (rhodium), Pd (palladium), Re (rhenium), Os (osmium), Ir, Pt, Au (gold), Cr, Fe, and Ni.) What is known as a "synthetic ferri-magnet type" is given as an example of the configuration of the ferromagnetic pinned layer. This is the configuration in which the two CoFe layers are antiferromagnetically interlayer-coupled with the Ru layer in between, and this configuration is expected to pin unidirectionally the direction of magnetization of the ferromagnetic pinned layer more firmly, and to achieve the effect of lessening the influence of magnetostatic coupling on an end of the element by reducing an effective amount of magnetization of the ferromagnetic pinned layer. A typical CoFe single layer or the like may be used to form the ferromagnetic pinned layer unless a particular problem arises. Although an instance is herein given where the ferromagnetic pinned layer is disposed toward the substrate, the layers may be stacked in reverse order in such a manner that the substrate, the seed layer, the ferromagnetic free layer, the non-magnetic intermediate layer, the ferromagnetic pinned layer, the antiferromagnetic layer, and the cap layer are formed in sequence.

After having been formed, the Spin-valve type GMR film was subjected to three-hour annealing treatment while being held at a temperature of 270° C. under a magnetic field in a vacuum, in order that the direction of magnetization of the ferromagnetic pinned layer 202 was pinned in a desired direction. The magnitude of the magnetic field was set to 4 MA/m (50 kOe) so that the ferromagnetic pinned layer 202 could be magnetized to sufficient saturation. With the annealing treatment, the MnPt antiferromagnetic layer undergoes phase transformation to form an ordered structure, and thereby unidirectional magnetic anisotropy can be imparted to the ferromagnetic pinned layer 202. Desirably, heat annealing temperature and time are appropriately adjusted according to a material for use (in particular, a material for the antiferromagnetic layer), a film thickness, and so on. Incidentally, the annealing treatment leads to the induction, into the ferromagnetic free layer 204, of uniaxial magnetic anisotropy such that the same direction coincides with the axis of easy magnetization. If the ferromagnetic free layer 204 has a problem with its coercivity or anisotropy field, the Spin-valve type GMR film may be subjected to annealing treatment under a magnetic field in the direction perpendicular to the above direction. In this case, the annealing treatment temperature and time and the magnitude of the applied magnetic field must be adjusted so as to prevent the magnetization of the ferromagnetic pinned layer 202 from excessively deviating from the desired direction.

The Spin-valve type GMR film was subjected to patterning into a substantially rectangular shape as shown in FIG. 4 by photo-lithography process and ion milling process (the details of which are omitted.) As employed herein, the substantially rectangular shape refers to the general shape having a length and a width and also permits the presence of concave and convex, curved and other portions. This is for the purpose of narrowing a pattern width W (or the width) of the magnetoresistive element, thereby narrowing space occupied by the magnetoresistive element in a magnetized pitch of the magnetic medium 1, and thereby increasing spatial resolution of a sensed signal magnetic field. On the other hand, a pattern length L (or the length) is increased, and electrical resistance of the overall sensor is set high by the passage of current along the length. This enables reducing power consumption during constant-voltage driving. To achieve sufficiently high resolution, the pattern width W can be set to $\lambda/4$ or less, where $\lambda$ denotes the magnetized pitch. Desirably, for example, the pattern width W of the magnetoresistive element is approximately 5 µm or less when the magnetized pitch of the magnetic medium 1 is 20 µm. In contrast, the pattern length is as long as about a few hundreds of micrometers, because longer pattern length enables lower power consumption, provided that the pattern length falls within the width of the magnetic medium 1 of the encoder.

In the Spin-valve type GMR film, the signal magnetic field has to be parallel to the magnetization of the ferromagnetic pinned layer. Accordingly, the direction of magnetization of the ferromagnetic pinned layer 202 has to be identical with the width direction of the magnetoresistive element and the magnetized direction of the magnetic medium 1 (or the direction of relative movement of the magnetic sensor 2 with respect to the magnetic medium 1).

Figure 5:
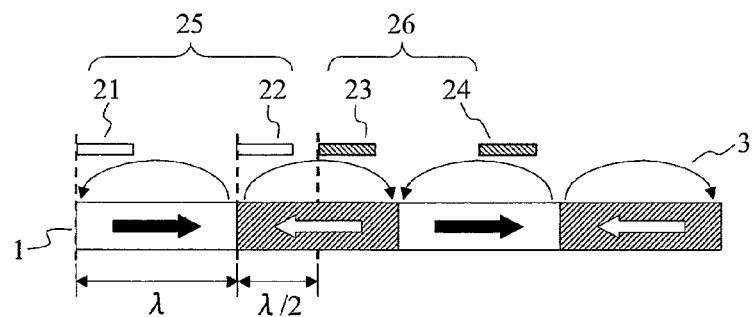
FIG. 5 is a cross-sectional view showing the relative dispositions of the magnetoresistive elements and the magnetic medium.
Figure 6:
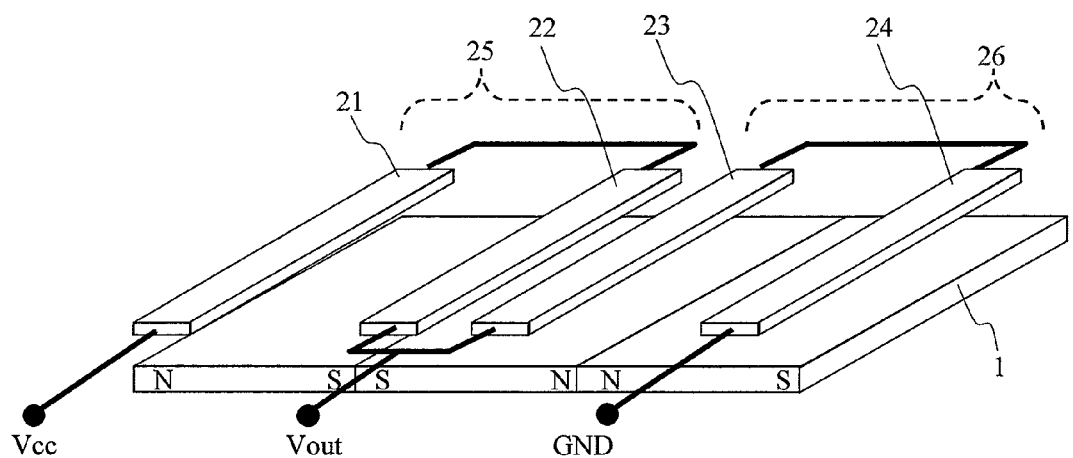
FIG. 6 is a perspective view illustrating a connection method for the magnetoresistive elements.

FIGS. 5 and 6 are a cross-sectional view and a perspective view, respectively, showing the relative positions of the magnetic medium 1 and the magnetic sensor 2. The magnetic medium 1 is magnetized in multipolar form with the pitch $\lambda$, where the pitch $\lambda$ is the length of each magnetized area in the magnetized direction. In FIG. 5, the opposed magnetized areas each having a length $\lambda$ alternate with each other, and the length of each period (or the length of a pair of the rightward and leftward magnetized areas) is $2\lambda$. The pitches of the rightward and leftward magnetized areas are each not necessarily limited to $\lambda$ but may be different from $\lambda$, provided that the length of each period is $2\lambda$. For the sake of simplicity of explanation, description will hereinafter be given with regard to an instance where the opposed magnetized areas each having the length $\lambda$ alternate with each other as shown in FIG. 5. The magnetic sensor 2 is formed of four connected magnetoresistive elements, is disposed as separated by a predetermined gap from the magnetic medium 1, and moves relative to the magnetic medium 1. The four magnetoresistive elements have approximately the same magnetoresistive properties. The four magnetoresistive elements are spaced at appropriate intervals in the direction of relative movement with respect to the magnetic medium 1. More specifically, two magnetoresistive elements 21 and 22 are spaced a distance $\lambda$ away from each other in the direction of relative movement, and are series-connected to form a first element group 25. Two magnetoresistive elements 23 and 24 are also spaced a distance $\lambda$ away from each other in the direction of relative movement, and are likewise series-connected to form a second element group 26. As shown in FIG. 5, one end of the first element array 25 is spaced a distance $\lambda/2$ away from one end of the second element array 26. All the magnetizations of the ferromagnetic pinned layers of the magnetoresistive elements 21, 22, 23 and 24 are oriented in the same direction. Description will be given with reference to FIG. 6 with regard to details of a connection method for the magnetoresistive elements.

As shown in FIG. 6, the magnetoresistive elements have a circuit configuration such that current passes through the elements along the pattern length, and that all the elements are series-connected. More specifically, the first element group 25 is connected at one end to an electric power supply Vcc and is connected at the other end to one end of the second element group 26. The second element group 26 is grounded at the other end, and a midpoint electric potential Vout is detected through a connection between the other end of the first element group 25 and one end of the second element group 26.

Although the number of magnetoresistive elements that constitute each element group is herein set to two, the number thereof may be 2n (where n denotes a natural number.) Increasing the number of magnetoresistive elements enables lessening the influence of variations in element properties. Moreover, superposition of signal phases of output signals from 2n magnetoresistive elements enables lessening the influence of the variations.

Figure 2:
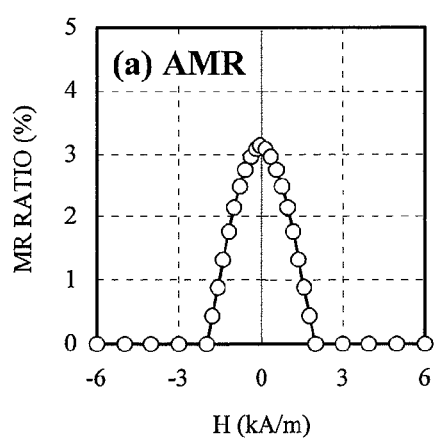
FIGS. 2A and 2B are plots showing typical magnetoresitance effect curves of an AMR element and a Spin-valve type GMR element, respectively.
Figure 2:
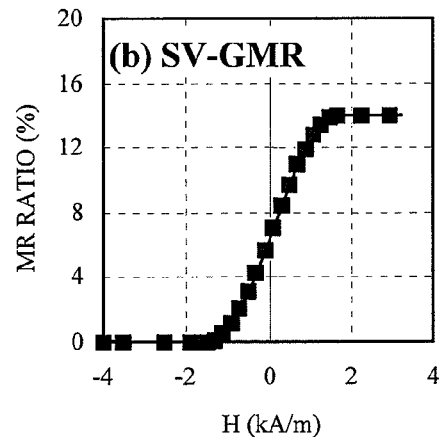
Figure 3:
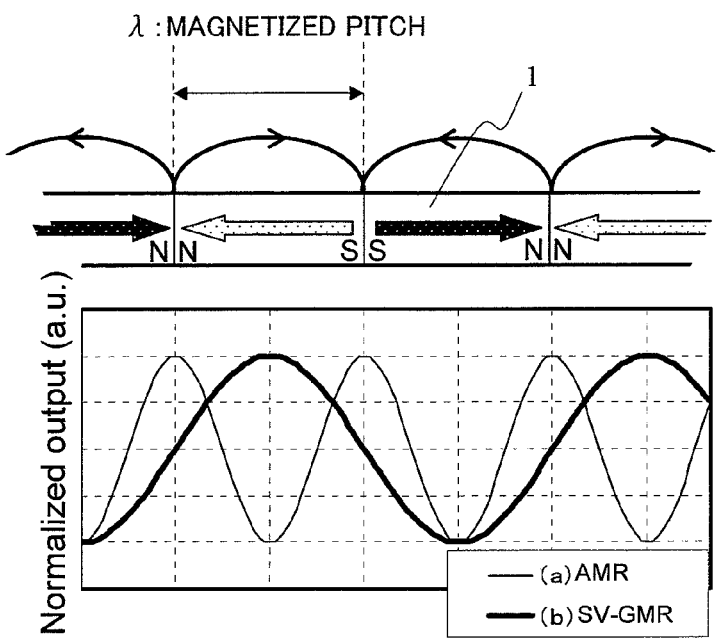
FIG. 3 is a graph showing a comparison of output characteristic periods of the AMR element and the Spin-valve type GMR element relative to a magnetized pitch of a magnetic medium.
Figure 7:
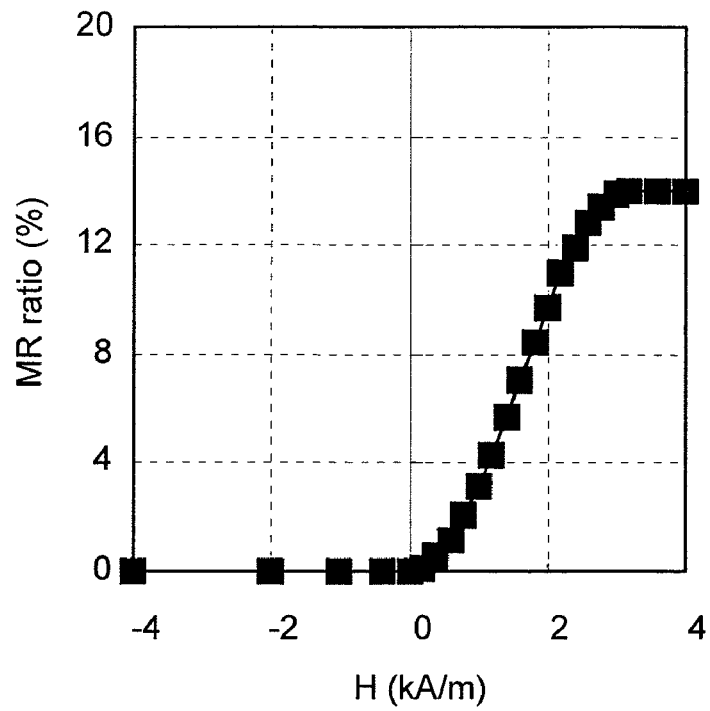
FIG. 7 is a plot showing a typical magnetoresitance effect curve of the Spin-valve type GMR element for use in a magnetic encoder.
Figure 8:
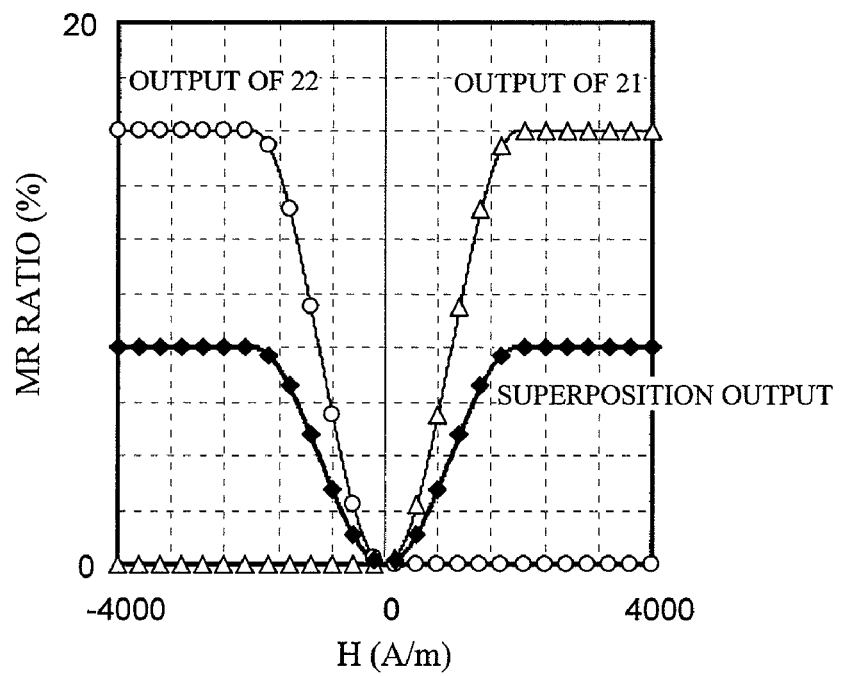
FIG. 8 is a plot showing a superposition output from two magnetoresistive elements.

Description will now be given with regard to the properties of the Spin-valve type GMR film required to achieve output characteristics having a period equal to the magnetized pitch $\lambda$ of the magnetic medium 1. FIG. 7 shows a typical magnetoresitance effect curve of the Spin-valve type GMR film for use in a high-resolution magnetic encoder. This curve is obtained by sweeping a magnetic field parallel to the direction of magnetization of the ferromagnetic pinned layer that is a structural component of the Spin-valve type GMR film, and expressing a change in resistance of the Spin-valve type GMR film as an MR ratio. The curve is characterized in that a waveform is intentionally shifted in one direction (in FIG. 7, the change in resistance occurs only in a positive direction of the magnetic field.) Such a waveform shift is accomplished by appropriately setting an interlayer coupling field Hint between the ferromagnetic pinned layer and the ferromagnetic free layer. Application of the Spin-valve type GMR film having such magnetoresistive properties to the magnetoresistive elements 21 and 22 shown in FIGS. 5 and 6 enables achieving superposition output as shown in FIG. 8 (incidentally, the MR ratio can be regarded as a synonym of output, because output is determined by the MR ratio, provided that constant-voltage driving takes place.) This results from the fact that the magnetoresistive elements 21 and 22 undergo resistance changes in opposite phases because of being subjected to opposite signal magnetic fields 3. Thereby, symmetrical resistance changes can occur in the positive and negative directions of an external magnetic field, as in the case of an AMR element shown in FIG. 2A.

Incidentally, the superposition output is inevitably half of output from the magnetoresistive element 21 or 22 alone because of originating from the series-connected magnetoresistive elements 21 and 22.

Figure 9A:
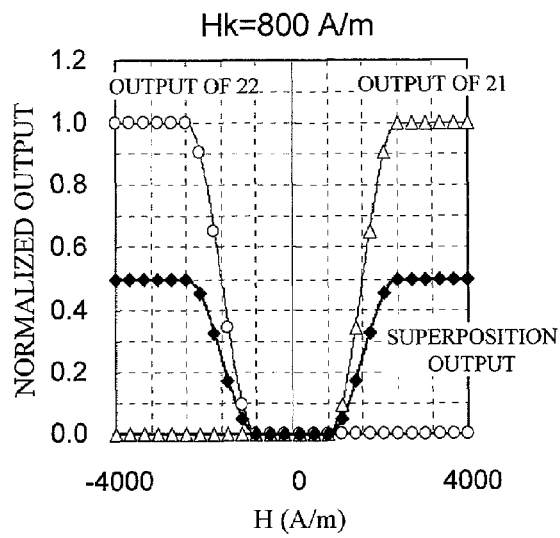
FIGS. 9A and 9B are plots showing a comparison of superposition outputs from the two magnetoresistive elements, where there are varying anisotropy fields.
Figure 9B:
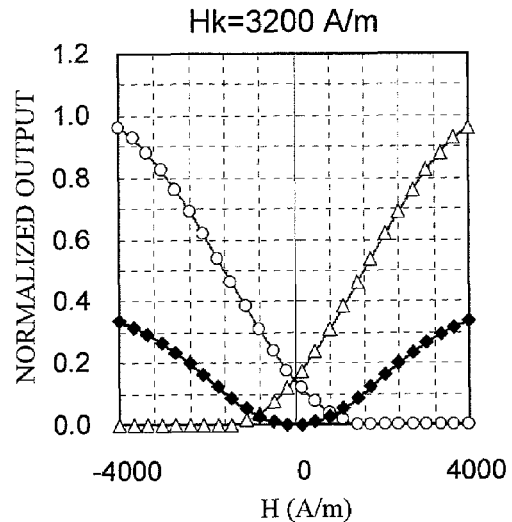

Description will be further given below with regard to what is important in preventing a decrease in the superposition output. FIGS. 9A and 9B show magnetoresitance effect curves of the magnetoresistive elements 21 and 22 and the superposed elements 21 and 22, which are observed when the ferromagnetic free layer has varying anisotropy fields Hk. In FIGS. 9A and 9B, the ferromagnetic interlayer coupling field Hint acting between the ferromagnetic pinned layer and the ferromagnetic free layer was 1600 A/m (20 Oe), and the anisotropy fields Hk were 800 A/m (10 Oe) (see FIG. 9A) and 3200 A/m (40 Oe) (see FIG. 9B) for comparison. In FIG. 9A, Hint is greater than Hk (Hint>Hk), and both the resistance changes of the magnetoresistive elements 21 and 22 occur only in a positive or negative magnetic field region. The superposition output is 50% of the output from the magnetoresistive element 21 or 22 alone. On the other hand, in FIG. 9B, Hint is less than Hk (Hint<Hk), and neither of the resistance change waves of the magnetoresistive elements 21 and 22 is completely shifted to the positive or negative magnetic field region. In this case, the superposition output is 40% or less of the output from the magnetoresistive element 21 or 22 alone due to the occurrence of output setoff in the vicinity of a zero magnetic field. Accordingly, in order to prevent a decrease in the superposition output due to the output setoff, it is therefore important that each individual magnetoresistive element undergo a resistance change by being completely shifted to the positive or negative magnetic field region. In short, this is accomplished by setting Hint and Hk so that these values satisfy the inequation, Hint≧Hk. However, the values must be appropriately adjusted because too large a Hint value makes it impossible to achieve a high MR ratio with respect to the signal magnetic field. As previously mentioned, the magnetoresistive element is formed in such a shape that the pattern width W<<the pattern length L. This leads to the shape anisotropy, which causes the induction, into the ferromagnetic free layer, of the uniaxial magnetic anisotropy such that the pattern length direction coincides with the axis of easy magnetization. Thus, the effective Hk* value becomes larger than the Hk value. The Hint and Hk values must be appropriately adjusted, allowing for the above.

Figure 10:
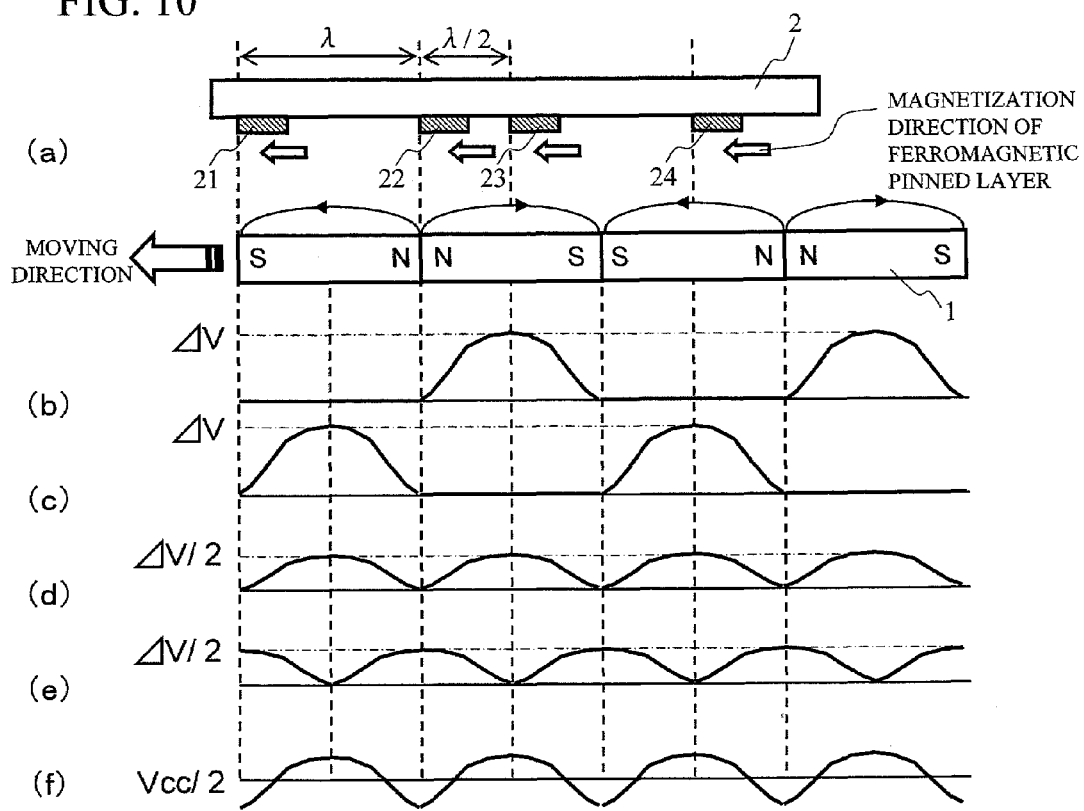
FIG. 10 includes parts (a)-(f) providing an illustration and charts of assistance in explaining the structure and operation of the magnetic encoder.

Description will now be given with reference to FIGS. parts (a)-(f) of FIG. 10 with regard to the principle of operation of the magnetic encoder according to the present invention. Part (a) of FIG. 10 is a schematic illustration of the magnetic encoder using the magnetic sensor 2 and the magnetic medium 1 according to the present invention. The magnetic medium 1 moves relative to the magnetic sensor 2, facing the magnetic sensor 2, leftward as seen in the drawing. The magnetizations of the ferromagnetic pinned layers of the magnetoresistive elements 21, 22, 23 and 24 that constitute the magnetic sensor 2 are oriented leftward as seen in the drawing. Actually, each of the magnetoresistive elements has a limited pattern width that cannot be neglected, and therefore, assuming that the magnetoresistive element is divided into fine regions in the pattern width direction leads to the result that the fine regions detect magnetic fields of different magnitudes. For the sake of convenience, description is herein given with regard to the operation, regardless of the pattern width. Parts (b) and (c) of FIG. 10 show changes in outputs from the magnetoresistive elements 21 and 22 with respect to a distance moved by the magnetic medium. Part (d) of FIG. 10 shows a change in output from the first element group 25 configured of the series-connected magnetoresistive elements 21 and 22. As previously mentioned, output amplitude from the element group 25 is half of output amplitude from the magnetoresistive element 21 or 22 alone, because the output from the element group 25 is a superposition of the outputs from the series-connected magnetoresistive elements 21 and 22. Likewise, part (e) of FIG. 10 shows a change in output from the second element group 26 configured of the series-connected magnetoresistive elements 23 and 24. Since the magnetoresistive element 23 is spaced a distance λ/2 away from the magnetoresistive element 22, an output wave from the second element group 26 is phase shifted λ/2 from an output wave from the first element group 25. Part (f) of FIG. 10 shows a change in the midpoint electric potential Vout at the connection between the first element group 25 and the second element group 26. It can be seen that the midpoint electric potential Vout that is an output from the magnetic sensor 2 is a signal having a period of λ as shown in part (f).

Figure 11:
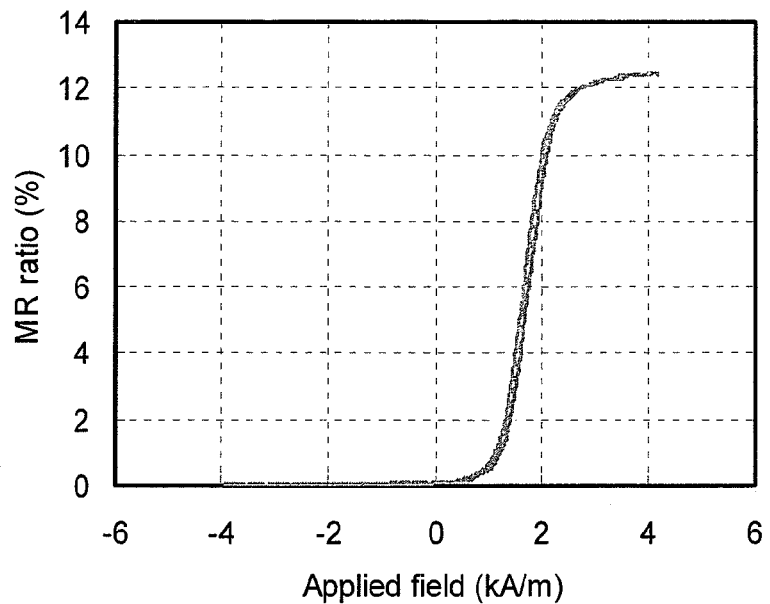
FIG. 11 is a plot showing a magnetoresitance effect curve of the prior art Spin-valve type GMR element for use in the magnetic encoder.

Description will be given with regard to the results of evaluations of the magnetic encoder fabricated of the above configuration. The Spin-valve type GMR film was configured of a glass substrate: the seed layer made of Ta of 2.5 nm thick, NiFeCr of 3.2 nm thick, and NiFe of 0.8 nm thick; the antiferromagnetic layer made of MnPt of 14 nm thick; the ferromagnetic pinned layer made of CoFe of 1.8 nm thick, Ru of 0.45 nm thick, and CoFe of 2.2 nm thick; the non-magnetic intermediate layer made of Cu of 2.35 nm thick; the ferromagnetic free layer made of CoFe of 1 nm thick and NiFe of 3 nm thick; and the cap layer made of Cu of 0.6 nm thick and Ta of 3 nm thick. After its deposition using sputtering method, the Spin-valve type GMR film was subjected to annealing treatment for three hours at 270° C. under a direct current magnetic field of 4 MA/m (50 kOe) in a vacuum, and thereby the direction of magnetization of the ferromagnetic pinned layer was pinned. FIG. 11 shows a magnetoresitance effect curve of the Spin-valve type GMR film used for the evaluations. Hint is about 1800 A/m (22.5 Oe), and a change in resistance occurs only in a positive magnetic field region. The Spin-valve type GMR film was fabricated in a width of 5 μm and a length of 100 μm to form the magnetoresistive element. At this point, the pinned direction of magnetization of the ferromagnetic pinned layer coincides with the pattern width direction. Four magnetoresistive elements were series-connected to form the magnetic sensor, as shown in FIG. 6. At this point, the magnetoresistive elements 21 and 22 were spaced a distance of 20 μm away from each other and the magnetoresistive elements 23 and 24 were spaced a distance of 20 μm away from each other. The magnetoresistive elements 22 and 23 were spaced a distance of 10 μm away from each other. The magnetic sensor and the magnetic medium having a magnetized pitch of 20 μm were used to evaluate the dependence of output on the gap between the magnetic sensor and the magnetic medium.

Figure 12:
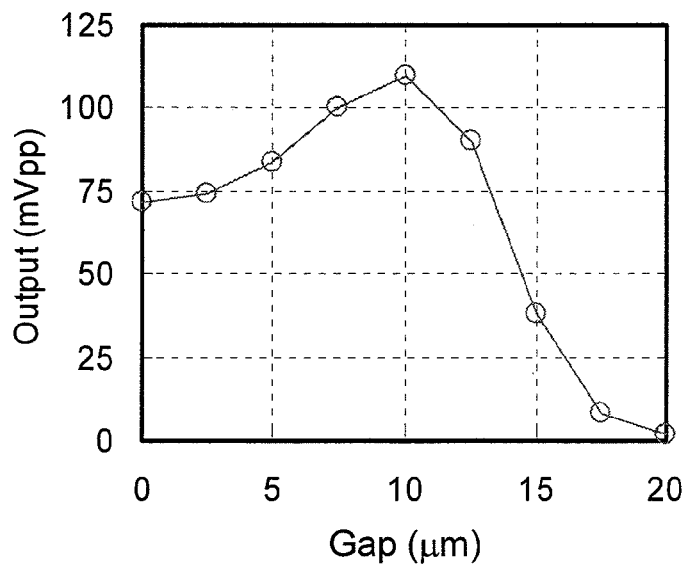
FIG. 12 is a plot showing the dependence of output from the prior art magnetic encoder upon a gap between a magnetic sensor and the magnetic medium.

FIG. 12 shows the dependence of output on the gap. When the gap is equal to 10 μm, the output has a maximum value. When the gap is more than 10 μm, the output decreases and can be understood to be affected by attenuation of signal magnetic field. It is therefore required that the magnetic sensor be disposed so as to avoid an excessively large gap in order to achieve a signal magnetic field of sufficient magnitude. On the other hand, when the gap is less than 10 μm, a decrease in the output takes place and becomes a large problem in bringing the magnetic encoder into operation. The reason is as follows: since the gap can possibly have some fluctuations, the dependence of the output on the gap as mentioned above can possibly impair reliability because of making it impossible to achieve stable output characteristics. Desirably, therefore, the magnetic encoder has improved output characteristics capable of achieving high resolution and also achieving high reliability with little change in output even at the occurrence of some variations in the gap.

Figure 13:
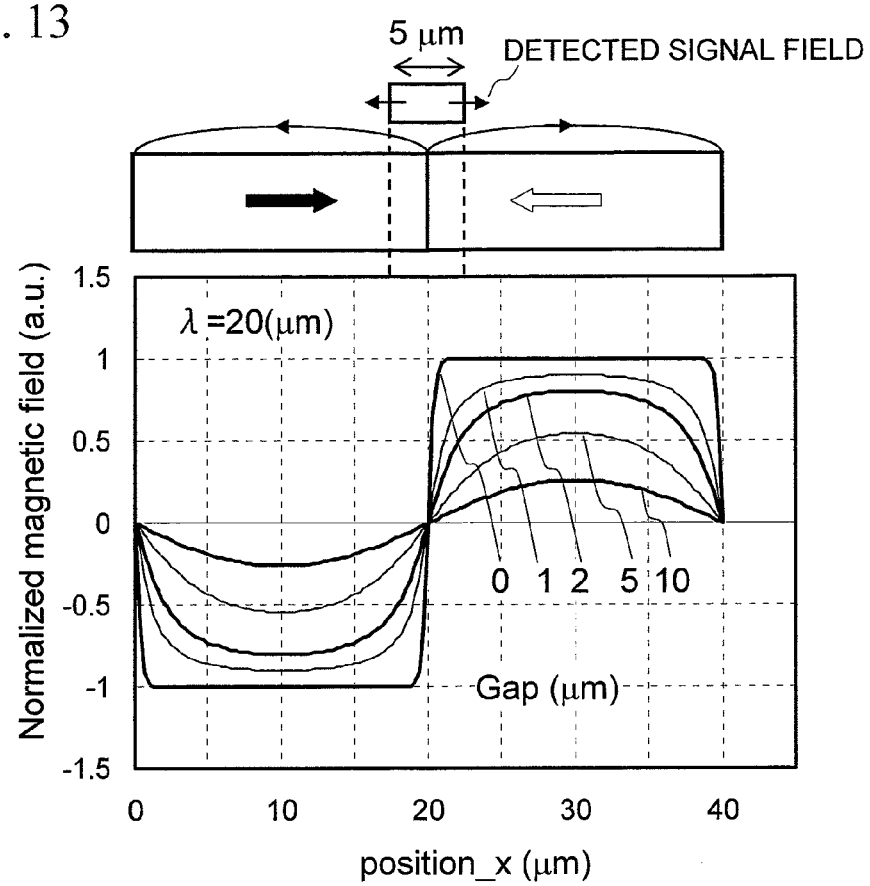
FIG. 13 is a graph showing the spatial distribution of a signal magnetic field from the magnetic medium.

Description will be given with regard to the cause of the decrease in the output in a region where the gap is narrow as mentioned above. As previously mentioned, actually, each of the magnetoresistive elements has a limited pattern width that cannot be neglected, and therefore, assuming that the magnetoresistive element is divided into fine regions in the pattern width direction leads to the result that the fine regions detect magnetic fields of different magnitudes. It is therefore necessary to take into account the spatial distribution of the signal magnetic field from the magnetic medium. FIG. 13 shows, in normalized form, the spatial distribution of the signal magnetic field originating from the magnetic medium, where the gap is a parameter. The magnetized pitch λ of the magnetic medium is 20 μm. In FIG. 13, there are additionally shown the relative positions of the magnetic medium and the magnetoresistive element having a pattern width of 5 μm.

As is apparent from FIG. 13, the narrower gap produces the larger maximum value of the signal magnetic field and also produces a sharper change in the magnetic field at a boundary between opposite magnetic fields. As shown in FIG. 13, when the center of the magnetoresistive element coincides with a boundary between magnetized bits of the magnetic medium, the signal magnetic field in the X direction directly at the boundary between the magnetized bits (position_X=20 μm) is zero regardless of the length of the gap. However, the magnetoresistive element detects leftward and rightward signal magnetic fields at its left end (position_X=17.5 μm) and right end (position_X=22.5 μm), respectively, provided that the magnetoresistive element has a pattern width of 5 μm. In particular, when the gap is 0 μm, the magnetoresistive element detects maximum leftward and rightward magnetic fields at its left and right ends, respectively. In other words, the fine regions detect different signal magnetic fields according to the position and correspondingly undergo resistance changes, assuming that the magnetoresistive element is divided into the fine regions. The resistance of the overall magnetoresistive element is the sum of the resistance changes of the fine regions. For example when the gap is 5 μm, the magnetoresistive element likewise detects the leftward and rightward magnetic fields at its left and right ends, respectively. However, an increase in the length of the gap reduces the strengths of the signal magnetic fields detected by the left and right ends of the magnetoresistive element, thus reducing the influence on the resistance change of the element.

Figure 14:
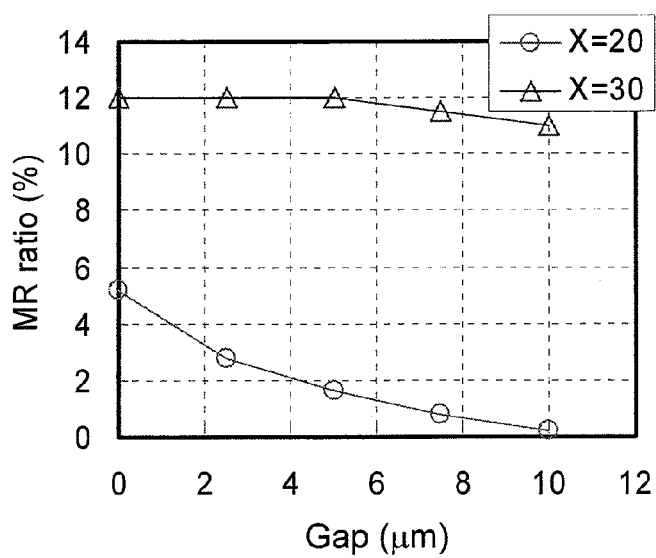
FIG. 14 is a plot showing a comparison of the dependence of the MR ratio of the magnetoresistive element upon the gap, where the magnetoresistive element is at varying positions.

FIG. 14 shows the dependence of the MR ratio of the magnetoresistive element upon the gap, which is observed when the center of the magnetoresistive element is at position_X in FIG. 13, where X=20 μm and X=30 μm. When X=30 μm, the strength of the signal magnetic field detected in the X direction has a maximum value in the case of each gap. Thus, the magnetoresistive element detects the signal magnetic field of sufficient magnitude for the ferromagnetic free layer to be magnetized to saturation. Accordingly, the magnetoresistive element exhibits substantially the same MR ratio close to 12% in the case of any gap. On the other hand, when X=20 μm, the signal magnetic field to be detected in the X direction is zero, and it is therefore desirable that the MR ratio of the magnetoresistive element be essentially zero. However, it can be seen that the narrower gap leads to the higher MR ratio of the magnetoresistive element. For example, when the gap is 0 μm, some of the fine regions of the magnetoresistive element detect signal magnetic fields of great magnitude and exhibit the maximum MR ratio of no less than 12%, and averaging of the resistance change of each individual region and summation of the resistance changes of the regions lead to the result that the overall magnetoresistive element exhibits a relatively high MR ratio of 5% or more. As for the output characteristics of the magnetic encoder, a final output level is determined by a difference between the MR ratio at the position X=20 μm and the MR ratio at the position X=30 μm. Desirably, therefore, there is a larger difference between the MR ratio at the position X=20 μm and the rate of resistance change at the position X=30 μm, and more desirably, the difference has a fixed value with respect to the gap.

Figure 15:
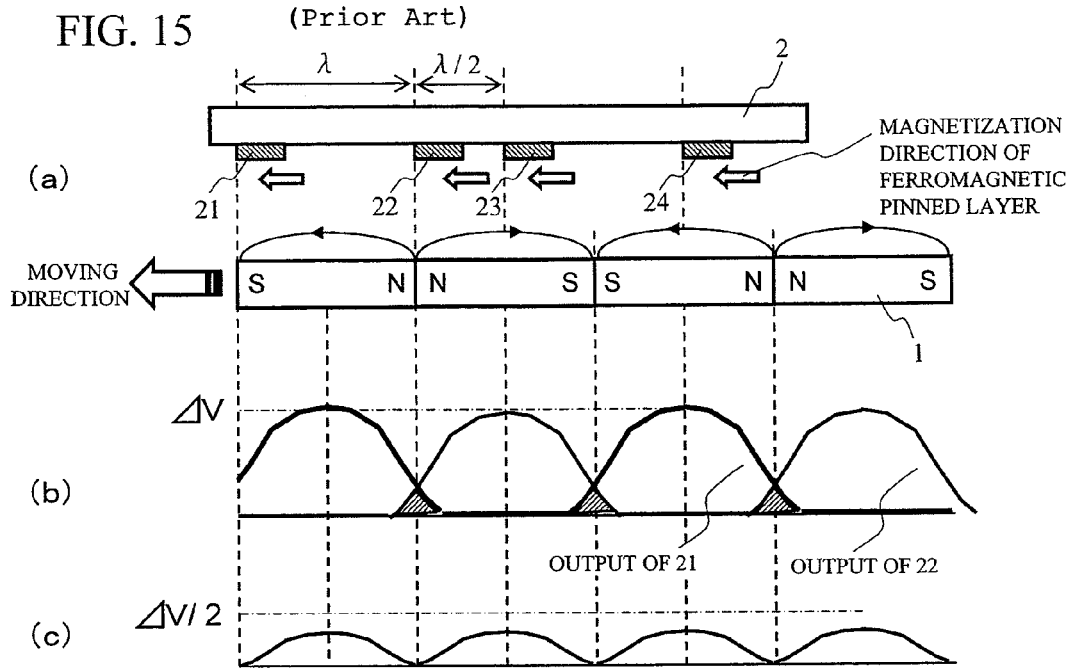
FIG. 15 includes parts (a)-(c) providing an illustration and charts of assistance in explaining a decrease in output, where the prior art is used.

Description will be given with reference to parts (a)-(c) of FIG. 15 with regard to an influence exerted on the output characteristics of the magnetic encoder by the dependence of the MR ratio on the gap as mentioned above. Description will be given assuming that the gap is 0 μm, although in part (a) of FIG. 15, the magnetic sensor 2 and the magnetic medium 1 are shown as disposed with a wide gap in between. Part (b) of FIG. 15 shows changes in outputs from the magnetoresistive elements 21 and 22 with respect to a distance moved by the magnetic medium. As previously mentioned, when the center of the magnetoresistive element coincides with the boundary between the magnetized bits of the magnetic medium, the signal magnetic field to be detected in the X direction is zero, and it is therefore desirable that the MR ratio of the magnetoresistive element be essentially zero. Actually, a resistance change that cannot be neglected, however, occurs due to the spatial spread of the element, when the center of the magnetoresistive element coincides with the boundary between the magnetized bits of the magnetic medium. Part (c) of FIG. 15 shows an output from the first element group 25 formed of a superposition of the outputs from the magnetoresistive elements 21 and 22. Although the output amplitude from the first element group 25 is inherently half of the output amplitude from the magnetoresistive element 21 or 22 alone, signals represented as the diagonally shaded areas in part (b) of FIG. 15 are offset, resulting in a significant decrease in the output amplitude from the first element group 25. Consequently, too narrow a gap causes a significant decrease in the amplitude of the midpoint electric potential Vout that is the output from the magnetic sensor 2.

Figure 16:
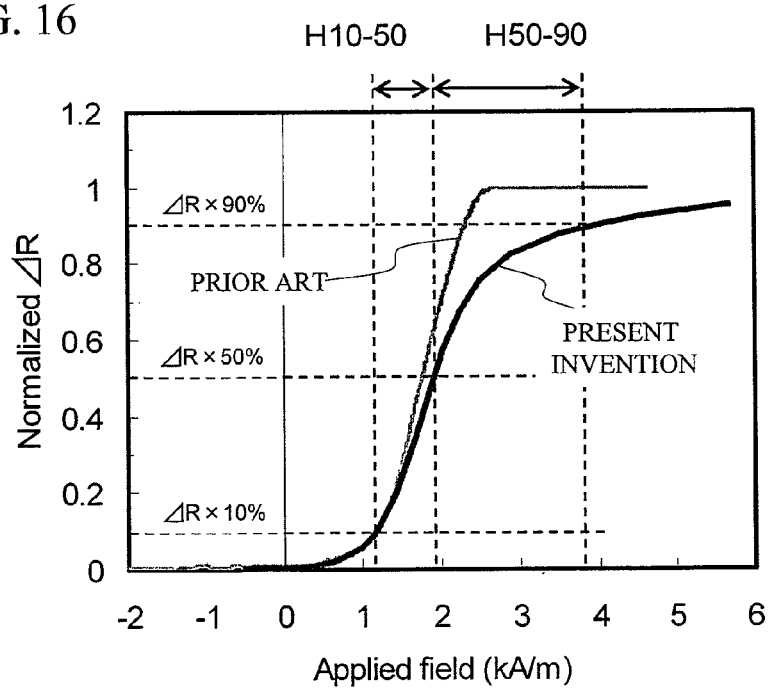
FIG. 16 is a graph showing a characteristic magnetoresitance effect curve of the magnetoresistive element for use in the magnetic encoder according to the present invention.

In order to solve this problem, the present invention uses the magnetoresistive element having a magnetoresitance effect curve as shown in FIG. 16. In FIG. 16, the vertical axis indicates, in normalized form, the amount of resistance change ΔR. The prior art exhibits substantially linear response to magnetic field, and a magnetic field required for a resistance change from ΔR×10% to ΔR×50% is substantially the same as that required for a resistance change from ΔR×50% to ΔR×90%. The present invention uses the magnetoresistive element having the magnetoresistive properties of exhibiting high sensitivity in a changing region where the normalized amount of resistance change increases from 0% to 50% and exhibiting low sensitivity in a changing region where the normalized amount thereof increases from 50% to its maximum value and reaches saturation. Specifically, the present invention uses the magnetoresistive element having the magnetoresistive properties that satisfy the inequation, H10–50<H50–90, where H10–50 represents the magnetic field required for the resistance change from ΔR×10% to ΔR×50% with respect to the amount of resistance change ΔR on the magnetoresitance effect curve, and H50–90 represents the magnetic field required for the resistance change from ΔR×50% to ΔR×90%.

Figure 17:
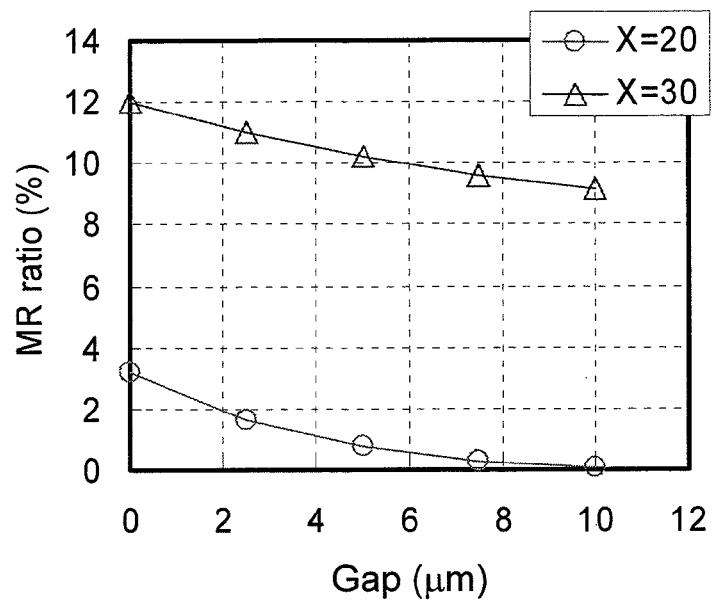
FIG. 17 is a plot showing a comparison of the dependence of the MR ratio of the magnetoresistive element of the present invention upon the gap, where the magnetoresistive element is at varying positions.

FIG. 17 shows the dependence, on the gap, of the MR ratio of the magnetoresistive element having the magnetoresistive properties in which H50−90/H10−50=2.8. In FIG. 17, there is shown a comparison with a situation where the center of the magnetoresistive element is at position_X in FIG. 13 where X=20 μm and X=30 μm, provided that the pattern width of the magnetoresistive element is 5 μm, and that the magnetized pitch of the magnetic medium is 20 μm. It can be seen that the absolute value of the rate of resistance change at X=20 μm decreases, as compared to that of the magnetoresistive element having the magnetoresistive properties in which H50−90/H10−50=1.0 as shown in FIG. 14. This suggests that, because the magnetoresistive element has the magnetoresistive properties of difficult magnetic saturation, the MR ratio of the overall magnetoresistive element is not very high even when the gap becomes narrow and thus allows partial detection of a signal magnetic field of great magnitude. It can be also seen that, because of the use of the magnetoresistive properties of difficult magnetic saturation, the MR ratio at X=30 μm also decreases monotonically when the gap becomes great and thus reduces a maximum signal magnetic field.

Figure 18:
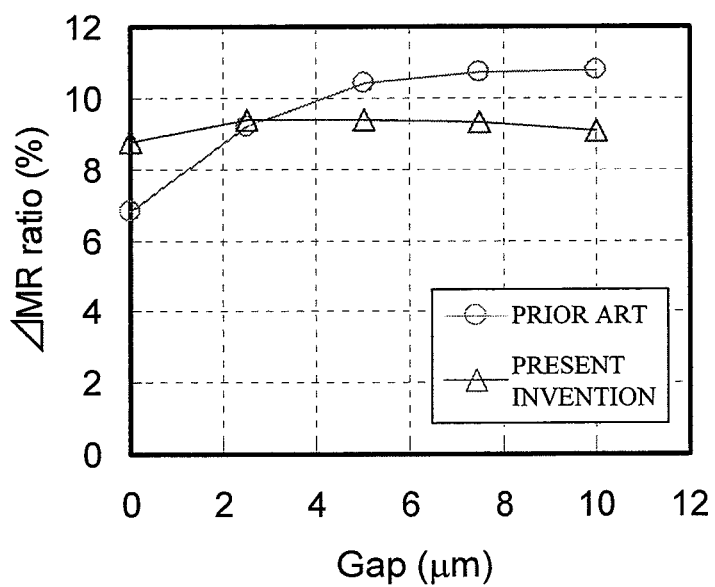
FIG. 18 is a plot of the dependence, upon the gap, of a difference between the maximum and minimum values of the MR ratio reflected by output, showing a comparison between the prior art and the present invention.

As previously mentioned, the output from the magnetic encoder reflects the difference between the MR ratio at X=20 μm and the MR ratio at X 30 μm in FIG. 13. FIG. 18 shows the dependence of the difference in the MR ratio upon the gap, showing a comparison between the prior art and the present invention. The prior art (H50−90/H10−50=1.0) corresponds to the difference between the MR ratio at X=20 μm and the MR ratio at X=30 μm in FIG. 14, and the present invention (H50−90/H10−50=2.8) corresponds to the difference between the MR ratio at X=20 μm and the MR ratio at X=30 μm in FIG. 17. With the use of the present invention, the difference in the MR ratio has a substantially fixed value even if the gap has varying values, as compared to the prior art. Accordingly, the use of the magnetoresistive element of the present invention enables preventing a decrease in output involved in the narrowed gap, achieving stable output even at the occurrence of variations in the gap, and thereby providing the magnetic encoder having high reliability.

Figure 19:
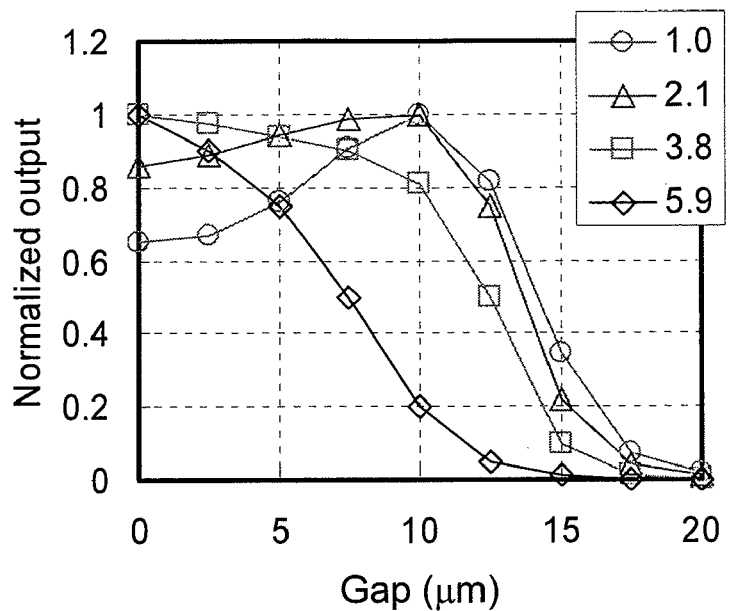
FIG. 19 is a plot showing the dependence of output from the magnetic encoder of the present invention upon the gap.

FIG. 19 shows the dependence of normalized output from the magnetic encoder upon the gap, where the H50−90/H10−50 ratio varies. The pattern width of the magnetoresistive element is 5 μm, and the magnetized pitch of the magnetic medium is 20 μm. As previously mentioned, if H50−90/H10−50=1.0, the output is maximized when the gap is 10 μm, and the output decreases greatly as the gap becomes narrower than 10 μm. On the other hand, as can be seen from FIG. 19, if H50−90/H10−50=2.1 or H50−90/H10−50=3.8, a decrease in output is suppressed in a region where the gap is narrower, and a change in output is slight over a wide range of gaps from about 0 to 10 μm. In other words, these instances are preferable because they achieve stable output even at the occurrence of variations in the gap. With the use of the magnetoresistive element having the magnetoresistive properties of excessively difficult saturation in which H50−90/H10−50=5.9, the output decreases monotonically as the gap becomes larger. In other words, this instance is not desirable because it suggests that the output varies with respect to the gap. This is understood to result from the fact that a great change in resistance does not take place because a signal magnetic field is of excessively small magnitude as compared to a magnetic field required for the magnetoresistive element to reach magnetic saturation.

Figure 20:
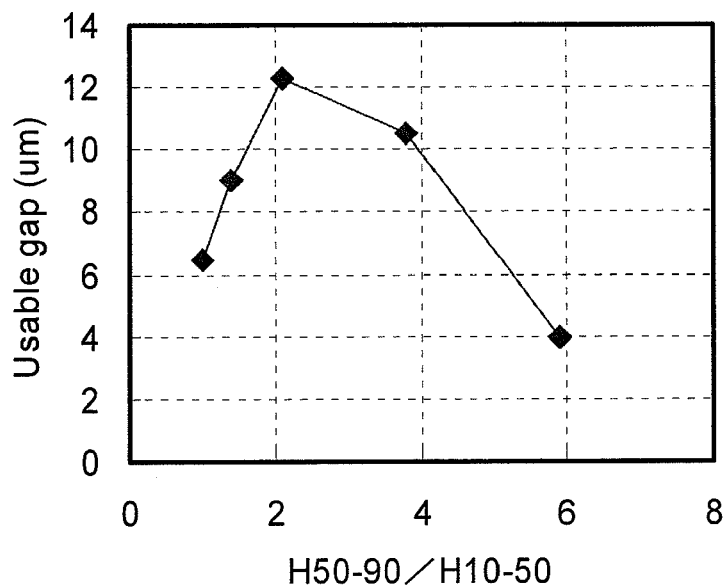
FIG. 20 is a plot showing a usable gap region for the magnetoresistive element having varying magnetoresistive properties.

FIG. 20 shows the dependence of a usable gap region upon the H50−90/H10−50 ratio, where the usable gap region is a gap region that gives 80% or more of maximum output. It can be seen that when the H50−90/H10−50 ratio is set to an appropriate value, a wide region of gaps of about 10 μm or more is usable. Specifically, when the H50−90/H10−50 ratio is set to lie between 1.5 and 4.0, the magnetic encoder having a sufficiently wide usable gap region can be provided.

Figure 21:
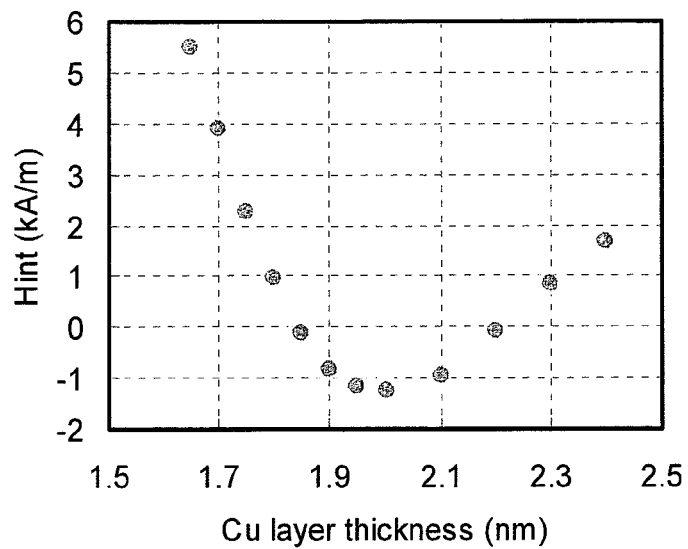
FIG. 21 is a plot showing the dependence of an interlayer coupling field Hint upon a Cu layer thickness of a non-magnetic intermediate layer.

A means for achieving the magnetoresistive properties of the present invention as shown in FIG. 16 includes the approach of making, locally nonuniform, the magnitude of ferromagnetic interlayer interaction Hint between the ferromagnetic pinned layer and the ferromagnetic free layer with the non-magnetic intermediate layer in between. When the magnetoresistive element locally has different interlayer interactions Hint, the overall magnetoresistive element exhibits the properties obtained through the averaging of the interactions Hint, thus enabling achievement of the magnetoresistive properties of the present invention as shown in FIG. 16. To make the magnitude of Hint locally nonuniform, the layer thickness distribution of the non-magnetic intermediate layer can be made locally nonuniform. FIG. 21 shows the dependence of Hint upon the Cu layer thickness of the non-magnetic intermediate layer. The Spin-valve type GMR film examined is configured of the glass substrate: the seed layer made of Ta of 2.5 nm thick, NiFeCr of 3.2 nm thick, and NiFe of 0.8 nm thick; the antiferromagnetic layer made of MnPt of 14 nm thick; the ferromagnetic pinned layer made of CoFe of 1.8 nm thick, Ru of 0.45 nm thick, and CoFe of 2.2 nm thick; the non-magnetic intermediate layer made of Cu (t); the ferromagnetic free layer made of CoFe of 1 nm thick and NiFe of 3 nm thick; and the cap layer made of Cu of 0.6 nm thick and Ta of 3 nm thick. Positive Hint means ferromagnetic interlayer coupling, and negative Hint means antiferromagnetic interlayer coupling. It can be seen that Hint changes relatively sharply according to a minute difference in the Cu layer thickness. Thus, this purpose is accomplished by forming the non-magnetic intermediate layer made of the Cu layer whose thickness undergoes tiny variations in local regions. For example, two regions of Cu layer thickness, give the appropriate Hint value of 1.6 kA/m (20 Oe). Since the former exhibits a great change in Hint with respect to the Cu layer thickness as compared to the latter, setting the Cu layer thickness in the vicinity of 1.78 nm facilitates achieving the magnetoresistive properties as shown in FIG. 16.

Figure 22:
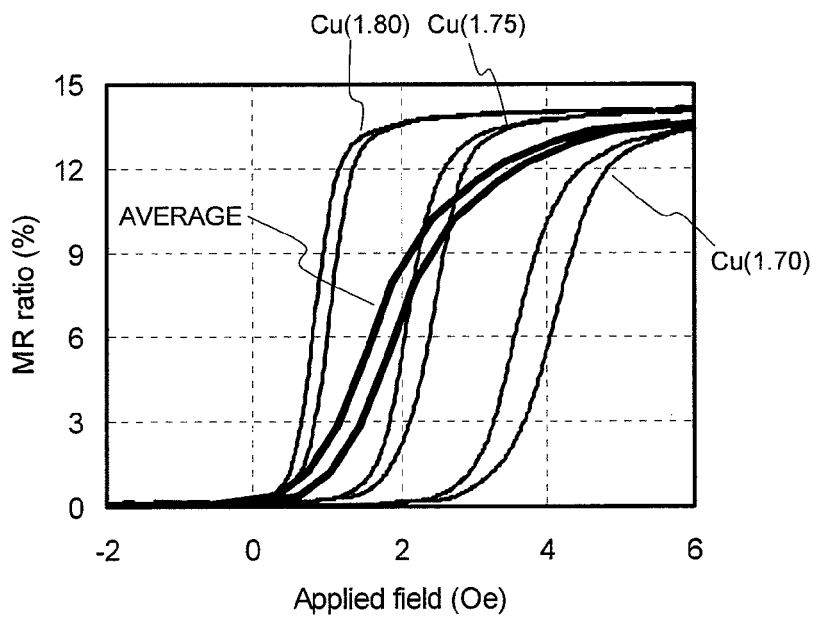
FIG. 22 is a plot showing magnetoresitance effect curves, where the Cu layer thickness is set to 1.70 nm, 1.75 nm, and 1.80 nm and the thicknesses are averaged.

FIG. 22 shows magnetoresitance effect curves, where the Cu layer thickness was set to 1.70 nm, 1.75 nm, and 1.80 nm. Hint was 3.9 kA/m (48.8 Oe), 2.3 kA/m (28.8 Oe), and 1.0 kA/m (12.5 Oe). In FIG. 22, there is additionally shown a magnetoresitance effect curve, which was obtained through the averaging of thicknesses when the Cu layer thickness of the non-magnetic intermediate layer contained 20% of a thickness of 1.70 nm, 60% of a thickness of 1.75 nm, and 20% of a thickness of 1.80 nm. This is none other than the desired magnetoresistive properties that satisfy the inequation, H10−50<H50−90. In other words, when the Cu layer of the non-magnetic intermediate layer has a locally nonuniform distribution of layer thickness with tolerance of about plus or minus 0.05 nm, the magnetoresistive properties that satisfy the inequation, H10−50<H50−90, are achieved. In process of examination of the conditions of formation of the Spin-valve type GMR film, it has been shown that reducing a deposition rate of the Cu layer to about 0.6 nm/min facilitates achieving the nonuniform distribution of layer thickness as mentioned above. Conversely, when the Cu layer thickness is set to a region of thicknesses, such as the vicinity of 1.78 nm, where Hint changes sharply with respect to the Cu layer thickness, wider tolerance of Hint may have to be set for wafers or lots, and it is therefore desirable that the Cu layer thickness be set to an appropriate value, allowing also for controllability. As for Hint, the controllability is improved by performing plasma process prior to formation of the non-magnetic intermediate layer, introducing a trace of oxygen before and after the formation of the non-magnetic intermediate layer, or appropriately selecting a material for the cap layer. An appropriate combination of these manufacturing methods enables achieving the desired magnetoresistive properties with high yields.

The description has been given assuming that the Hint value is set to a plus (or the ferromagnetic interlayer coupling). However, even if the Hint value is set to a minus (or the antiferromagnetic interlayer coupling), the Hint value can be used for the magnetic encoder of the present invention in precisely the same way. As is apparent from FIG. 21, the negative Hint value having an absolute value large enough for use in the magnetic encoder is obtained in the vicinity of a Cu layer thickness of 2.0 nm. Since the configuration of such a Spin-valve type GMR film and a manufacturing method therefor, except for the Cu layer thickness, are identical with those mentioned above, detailed description thereof is omitted.

Figure 23:
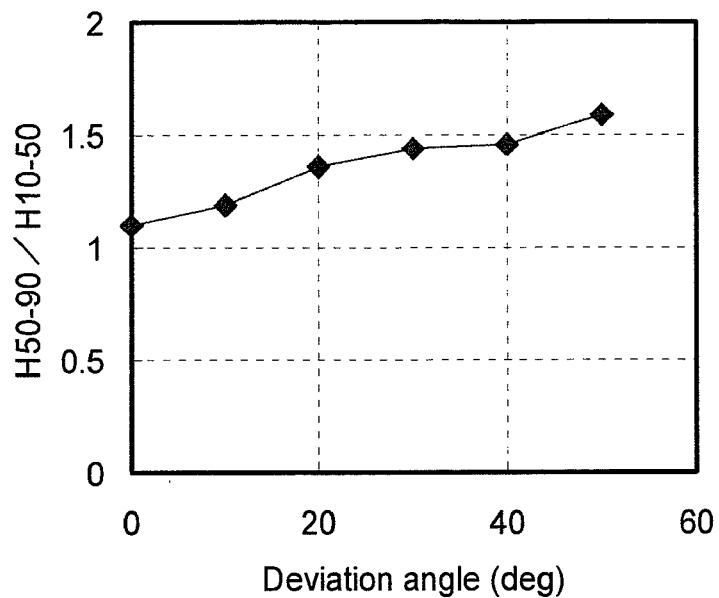
FIG. 23 is a plot showing a difference in magnetoresistive properties, where the direction of magnetization of a ferromagnetic pinned layer varies.
Figure 24:
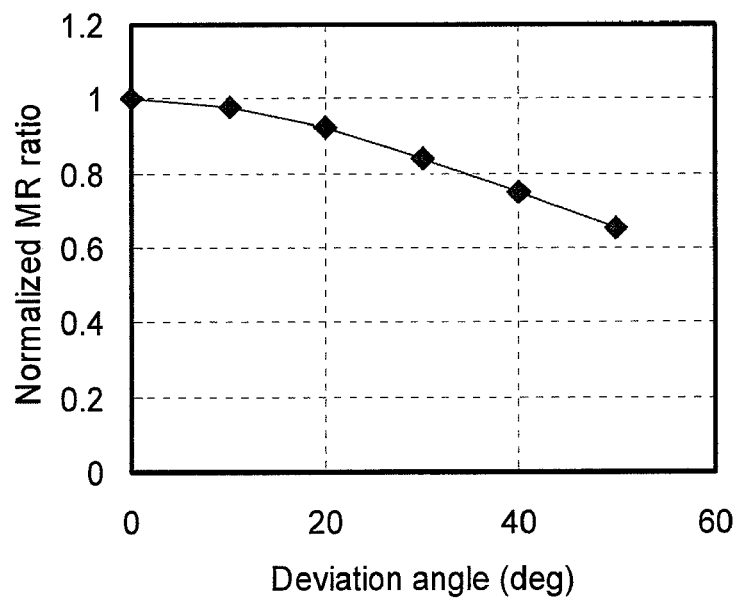
FIG. 24 is a plot showing a change in the MR ratio with respect to the direction of magnetization of the ferromagnetic pinned layer.

Other auxiliary means for achieving the magnetoresistive properties of the present invention as shown in FIG. 16 include the approach of intentionally deviating the direction of magnetization of the ferromagnetic pinned layer from the magnetized direction of the magnetic medium (or the pattern width direction of the magnetoresistive element). FIG. 23 shows a change in the H50–90/H10–50 ratio with respect to a deviation angle of the direction of magnetization of the ferromagnetic pinned layer. It can be seen that the H50–90/H10–50 ratio increases monotonically as the deviation angle of the direction of magnetization of the ferromagnetic pinned layer increases. As shown in FIG. 24, however, the MR ratio decreases as the deviation angle of the direction of magnetization of the ferromagnetic pinned layer increases, and it is therefore required that the deviation angle be appropriately controlled. Preferably, the deviation angle is set at 30 degrees or less, according to the degree of decrease in the MR ratio.

Figure 25:
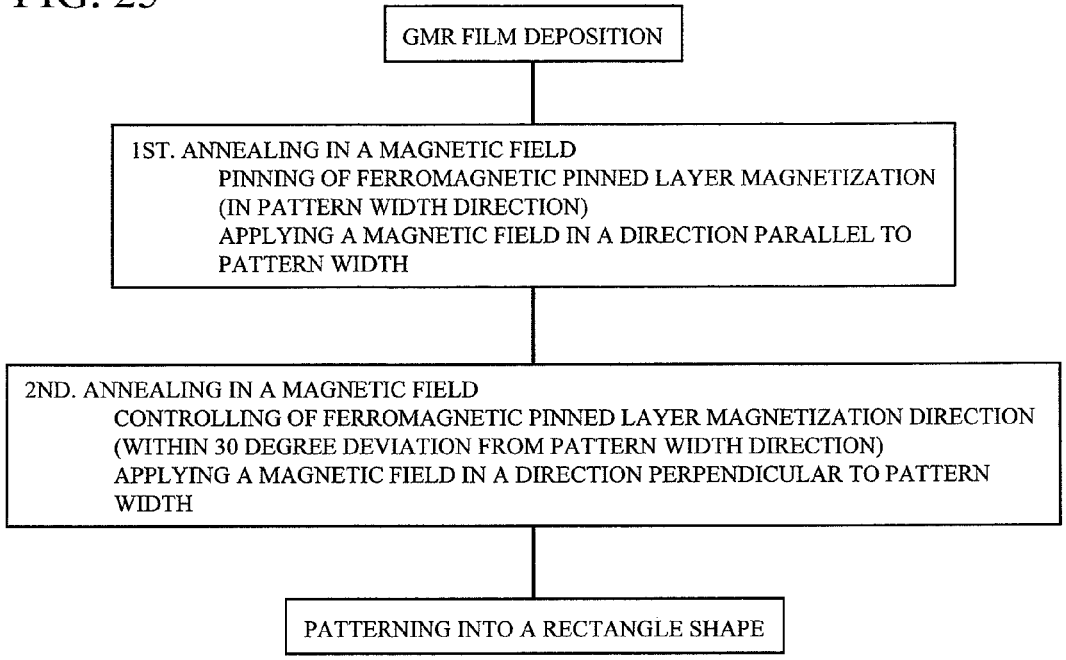
FIG. 25 is a flowchart of a manufacturing method for controlling the direction of magnetization of the ferromagnetic pinned layer.

Description will be given with regard to a manufacturing method that includes intentionally deviating the direction of magnetization of the ferromagnetic pinned layer from the magnetized direction of the magnetic medium. FIG. 25 shows a flowchart about the manufacturing method. After having been formed, the Spin-valve type GMR film is subjected to first annealing treatment under magnetic field in a vacuum, while being subjected to a magnetic field in the pattern width direction of the magnetoresistive element (or the magnetized direction of the magnetic medium), the magnetic field being of such magnitude that the direction of magnetization of the ferromagnetic pinned layer reaches sufficient magnetic saturation. By the annealing treatment, the direction of magnetization of the ferromagnetic pinned layer is fixed in the pattern width direction of the magnetoresistive element. The annealing treatment can take place at a temperature of about 230 to 300° C. for a duration of the order of a few hours. A annealing treatment temperature exceeding 300° C. is not desirable because it can possibly cause interdiffusion on an interface between the layers and hence cause a decrease in the MR ratio. Then, the Spin-valve type GMR film is subjected to second annealing treatment under magnetic field in a vacuum, while being subjected to a magnetic field in a direction perpendicular to the above-mentioned direction (or in the pattern length direction of the magnetoresistive element). By the annealing treatment, the direction of magnetization of the ferromagnetic pinned layer is fixed in a direction deviating from the pattern width direction of the magnetoresistive element. It is required that the conditions of the second annealing treatment under magnetic field be appropriately adjusted, because too great an angle of deviation of the direction of magnetization of the ferromagnetic pinned layer causes the decrease in the MR ratio as mentioned above. The most important parameter is the magnitude of the applied magnetic field, and the magnitude thereof can be set according to the resistance of the magnetization of the ferromagnetic pinned layer to an external magnetic field.

For our examination, the conditions of the first annealing treatment under magnetic field were 270° C. and three hours under an applied magnetic field of 4 MA/m (50 kOe) in the pattern width direction of the magnetoresistive element, and the conditions of the second annealing treatment under magnetic field were 250° C. and three hours under an applied magnetic field of 80 kA/m (1 kOe) in the direction perpendicular to the pattern width direction (or in the pattern length direction). The second annealing treatment under magnetic field induces into, the ferromagnetic free layer, the uniaxial magnetic anisotropy such that the pattern length direction coincides with the axis of easy magnetization, resulting in also the effect of achieving good soft magnetic properties. Incidentally, the second annealing treatment under magnetic field can apply a magnetic field containing at least a component in the direction perpendicular to the pattern width direction of the magnetoresistive element to thereby, in the same manner, deviate the direction of magnetization of the ferromagnetic pinned layer from the pattern width direction. The same effect is achieved, for example, by performing the annealing treatment under magnetic field through the application of a magnetic field in a direction that forms an angle of 45 degrees with respect to the pattern width direction. Also in this case, it is required that the magnitude of the applied magnetic field be appropriately adjusted. Finally, the Spin-valve type GMR film is subjected to patterning into a substantially rectangular shape to thereby yield the magnetoresistive element. The order in which the processes are performed may be changed so that the patterning can take place immediately after the formation of the Spin-valve type GMR film. However, there arises the need to appropriately set the conditions of the annealing treatment under magnetic field, noting that, after the patterning, the control of the direction of magnetization can possibly become difficult under the influence of a diamagnetic field on the end of the element.

Description will be given with regard to the results of evaluations of the magnetic encoder fabricated by using the above-mentioned configuration and manufacturing method. The Spin-valve type GMR film was formed by use of sputtering method. The Spin-valve type GMR film was configured of the glass substrate: the seed layer made of Ta of 2.5 nm thick, NiFeCr of 3.2 nm thick, and NiFe of 0.8 nm thick; the antiferromagnetic layer made of MnPt of 14 nm thick; the ferromagnetic pinned layer made of CoFe of 1.8 nm thick, Ru of 0.45 nm thick, and CoFe of 2.2 nm thick; the non-magnetic intermediate layer made of Cu of 1.75 nm thick; the ferromagnetic free layer made of CoFe of 1 nm thick and NiFe of 3 nm thick; and the cap layer made of Cu of 0.6 nm thick and Ta of 3 nm thick. Then, the Spin-valve type GMR film was subjected to the first annealing treatment under magnetic field, the conditions of which were 270° C. and three hours in a vacuum under an applied magnetic field of 4 MA/m (50 kOe) in the pattern width direction of the magnetoresistive element. Subsequently, the Spin-valve type GMR film was subjected to the second annealing treatment under magnetic field, the conditions of which were 250° C. and three hours under an applied magnetic field of 80 kA/m (1 kOe) in the direction perpendicular to the pattern width direction of the magnetoresistive element. Under this condition, measurements were made to determine the magnetoresistive properties, while sweeping the magnetic field. The results of the measurements were an interlayer coupling field Hint of 1.9 kA/m (23.8 Oe) or less and H50–90/H10–50=2.8. The Spin-valve type GMR film was subjected to patterning in a pattern width of 5 μm and a pattern length of 100 μm by photolithography process and ion milling process (the details of which are omitted) to thereby yield the magnetoresistive element. As shown in FIG. 6, four magnetoresistive elements were series-connected to form the magnetic sensor. Specifically, the magnetoresistive elements 21 and 22 were disposed as spaced a distance of 20 μm away from each other, the magnetoresistive elements 23 and 24 were disposed as spaced a distance of 20 μm away from each other, and the magnetoresistive elements 22 and 23 were disposed as spaced a distance of 10 μm away from each other. As shown in FIG. 6, the magnetoresistive element 21 was connected at one end to the electric power supply Vcc, and the magnetoresistive element 24 was connected at one end to a ground GND. The midpoint electric potential was detected between the magnetoresistive elements 22 and 23 and was used for output evaluation. The magnetic medium was used as magnetized in alternating multipolar form with a pitch λ of 20 μm, as shown in FIG. 5. The magnetic sensor was disposed in such a manner that the pattern width direction coincided with the magnetized direction of the magnetic medium. Output evaluations were performed for gaps of varying lengths between the magnetic sensor and the magnetic medium. When the gap is laid between 0 and 11.5 μm, the normalized output was 0.85 or more, and stable output characteristics could be achieved even at the occurrence of variations in the gap. In other words, the magnetic sensor suitable for high resolution and having high reliability, and the magnetic encoder using the magnetic sensor could be fabricated.

Second Embodiment

As previously mentioned, the magnetoresistive element is of such a shape that the pattern length L is very great as compared to the pattern width W. The narrower pattern width W is more favorable in particular for an increase in the resolution for detection of the signal magnetic field from the magnetic medium. However, an increase in an aspect ratio of the pattern length L to the pattern width W results in the shape anisotropy, which causes the induction, into the ferromagnetic free layer, of the uniaxial magnetic anisotropy such that the direction of the pattern length L coincides with the axis of easy magnetization. Thus, the effective Hk* value of the magnetoresistive element becomes larger than the Hk value of the ferromagnetic free layer in itself. This is not desirable because it not only reduces the sensitivity of the magnetoresistive element to the magnetic field but also causes output setoff and hence a decrease in output at the time of superposition of outputs from two magnetoresistive elements, as shown in FIG. 9B. A uniaxial anisotropy field resulting from the shape anisotropy increases in inverse proportion to the pattern width W and in proportion to the amount of magnetization of the ferromagnetic free layer, if the pattern length L is fixed. A reduction in the amount of magnetization of the ferromagnetic free layer is therefore effective for suppression of an increase in the uniaxial anisotropy field resulting from the shape anisotropy. However, a simple reduction in the thickness of the ferromagnetic free layer for the reduction in the amount of magnetization thereof is not desirable because of causing a decrease in the MR ratio, an increase in the coercivity of the ferromagnetic free layer, difficulty in controlling the interlayer coupling field Hint, and so on.

Figure 26:
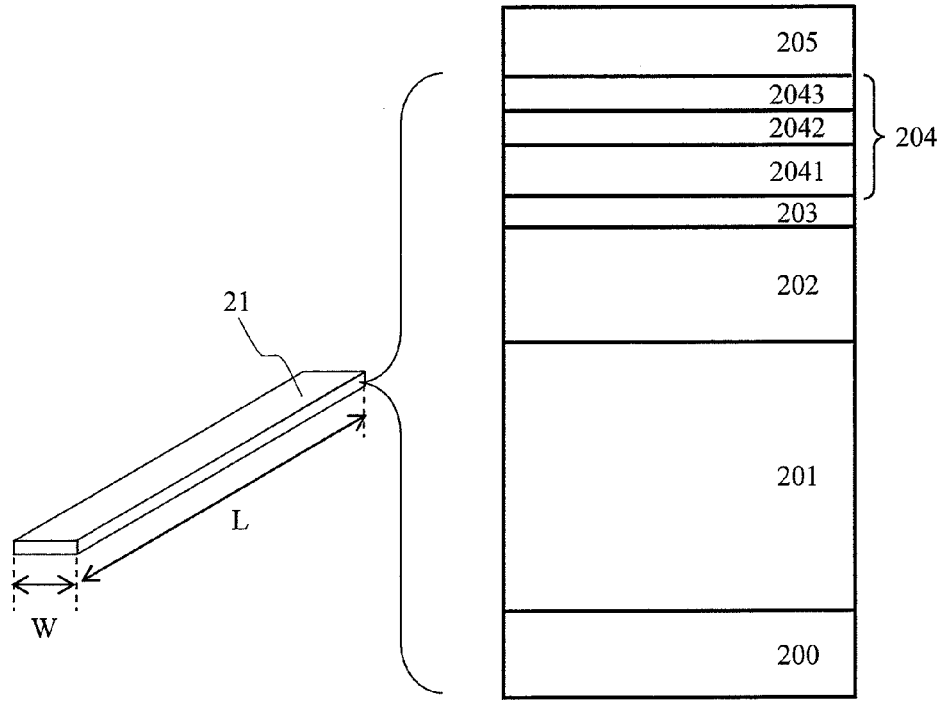
FIG. 26 is a schematic illustration of the configuration of the magnetoresistive element using a ferromagnetic free layer of a configuration of a synthetic ferri-magnet type.

To reduce the amount of magnetization of the ferromagnetic free layer without causing such problems, the ferromagnetic free layer of a configuration of a so-called "synthetic ferri-magnet" type is effective. Specifically, a ferromagnetic free layer 204 is configured of a first soft magnetic layer 2041, an antiferromagnetic interlayer coupling layer 2042, and a second soft magnetic layer 2043, as the configuration of the magnetoresistive element is illustrated schematically in FIG. 26. In this configuration, the first and second soft magnetic layers are antiferromagnetically coupled with the antiferromagnetic interlayer coupling layer in between. In other words, the magnetizations of the two soft magnetic layers are oriented in antiparallel relation, and the substantial amount of magnetization of the ferromagnetic free layer corresponds to a difference between the amounts of magnetizations of the first and second soft magnetic layers. For example, the substantial amount of magnetization of the ferromagnetic free layer can be 2 T·nm (4−2=2 T·nm), assuming that the amount of magnetization of the first soft magnetic layer is 4 T·nm, which is determined by calculating the product of saturated magnetic flux density and layer thickness, and the amount of magnetization of the second soft magnetic layer is 2 T·nm. When antiferromagnetic interlayer coupling between the two soft magnetic layers with the antiferromagnetic interlayer coupling layer in between is set much stronger than the strength of the signal magnetic field from the magnetic medium, the two soft magnetic layers integrally function as a single ferromagnetic free layer having a small amount of magnetization. This configuration can suppress a decrease in the MR ratio because of being able to keep great the thickness of the soft magnetic layer in contact with the non-magnetic intermediate layer.

Figure 27:
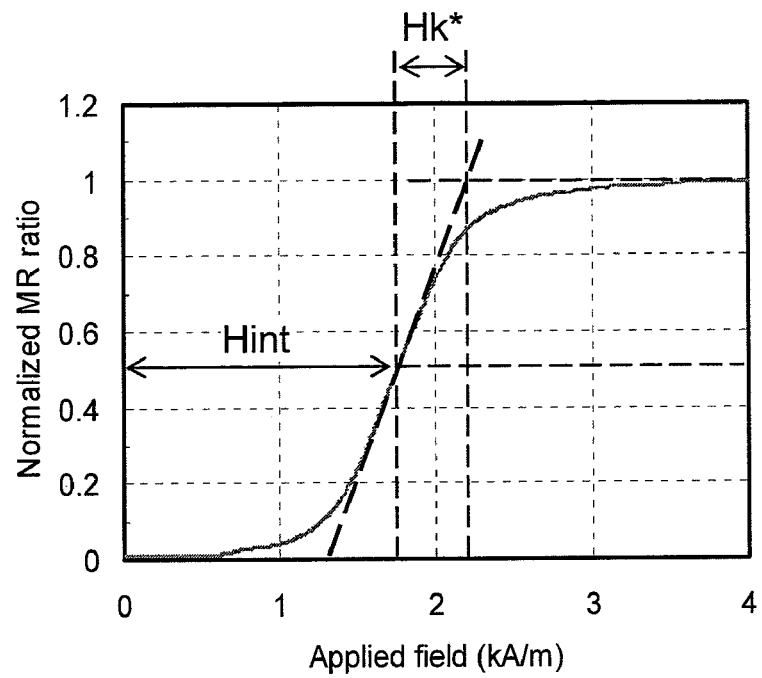
FIG. 27 is a graph illustrating definitions of the interlayer coupling field Hint and an effective anisotropy field Hk* on a magnetoresitance effect curve.

A comparison will now be made, as to the relation between the effective anisotropy field Hk* and the pattern width W of the magnetoresistive element, between the ferromagnetic free layer of a typical configuration and the ferromagnetic free layer of a synthetic ferri-magnet type configuration. Firstly, definition of Hk* will be described with reference to FIG. 27. Assuming that the magnetoresistive element has a magnetoresitance effect curve as shown in FIG. 27, and that the interlayer coupling field Hint is the magnetic field at a point where the MR ratio is ½ of its maximum value, the result of subtraction of Hint from the magnetic field at a point of intersection of a tangent to the curve at the above point and the maximum MR ratio is defined as Hk*.

Figure 28:
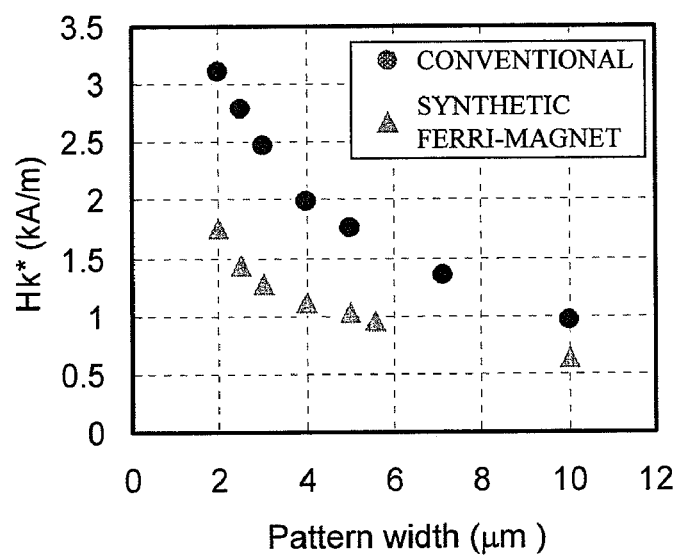
FIG. 28 is a plot showing the dependence of the effective anisotropy field Hk* upon a pattern width.

FIG. 28 shows the dependence of the effective anisotropy field Hk* estimated from the magnetoresitance effect curve of the magnetoresistive element upon the pattern width W. The pattern length is 100 μm. Shown is a comparison between the use of the ferromagnetic free layer of the typical configuration and the use of the ferromagnetic free layer of the synthetic ferri-magnet type configuration. The Spin-valve type GMR film is configured basically of: the seed layer made of NiCrFe of 3.2 nm thick and NiFe of 0.8 nm thick; the antiferromagnetic layer made of MnPt of 14 nm thick; the ferromagnetic pinned layer made of CoFe of 1.5 nm thick, Ru of 0.46 nm thick, and CoFe of 1.5 nm thick; the non-magnetic intermediate layer made of Cu; the ferromagnetic free layer; and the cap layer made of Cu of 0.6 nm thick and Ta of 2.0 nm thick. The ferromagnetic free layer of the typical configuration was made of CoFe of 1.0 nm thick and NiFe of 2.0 nm thick, and the ferromagnetic free layer of the synthetic ferri-magnet type configuration was made of CoFe of 1.0 nm thick, NiFe of 2.0 nm thick, Ru of 0.46 nm thick, and NiFe of 1.0 nm thick. The effective amount of magnetization of the ferromagnetic free layer of the typical configuration was 3.6 T·nm, and the effective amount of magnetization of the ferromagnetic free layer of the synthetic ferri-magnet type configuration was 2.7 T-nm. In order for the interlayer coupling field Hint to be 1.6 kA/m (20 Oe), the thickness of the non-magnetic intermediate layer, namely, the Cu layer, of the typical configuration was 2.4 nm, and the thickness of the Cu layer of the synthetic ferri-magnet type configuration was 2.35 nm.

From FIG. 28, it can be seen that the effective anisotropy field Hk* increases as the pattern width decreases. The ferromagnetic free layer of the typical configuration has the larger Hk* value than the ferromagnetic free layer of the synthetic ferri-magnet type configuration, and a difference between the Hk* values increases particularly as the pattern width decreases. The difference is understood to result from a difference in the effective amount of magnetization of the ferromagnetic free layer. For example, when the pattern width is 5 μm, the ferromagnetic free layer of the synthetic ferri-magnet type configuration has an effective anisotropy field Hk* of 1.0 kA/m (Hk*=12.5 Oe), whereas the ferromagnetic free layer of the typical configuration has an effective anisotropy field Hk* of 1.8 kA/m (Hk*=22.5 Oe), which is larger than the interlayer coupling field Hint. The effective anisotropy field Hk* exceeding the interlayer coupling field Hint is not desirable because of causing the output setoff at the time of superposition of the outputs from the two magnetoresistive elements, as previously mentioned. In other words, the synthetic ferri-magnet type configuration is applied to the ferromagnetic free layer to reduce the effective amount of magnetization thereof, thereby making it possible to suppress an increase in the effective anisotropy field Hk* even if the pattern width is reduced. Accordingly, the use of the configuration of the present invention enables achieving high response sensitivity even if the pattern width is narrowed, thus achieving the magnetic encoder having high resolution.

Consequently, the first embodiment is modified to use the ferromagnetic free layer of the synthetic ferri-magnet type configuration made of CoFe of 1.0 nm thick, NiFe of 2.0 nm thick, Ru of 0.46 nm thick, and NiFe of 1.0 nm thick, in place of the ferromagnetic free layer of the typical configuration made of CoFe of 1.0 nm thick and NiFe of 2.0 nm thick. This enables making the pattern width still narrower, as well as suppressing output variations due to fluctuations in the gap between the magnetic sensor and the magnetic medium as described for the first embodiment, thereby providing the magnetic encoder having still higher resolution. Since the basic configurations of the magnetoresistive element, the magnetic sensor and the magnetic encoder and the manufacturing methods therefor, except for the configuration of the ferromagnetic free layer, are precisely the same as those of the first embodiment, detailed description thereof is omitted.

Using the configuration and manufacturing method as described above makes it possible to fabricate the magnetic sensor having high resolution and also having high reliability with little change in output even at the occurrence of variations in the gap between the magnetic sensor and the magnetic medium, and the magnetic encoder using the magnetic sensor.

What is claimed is:

1. A magnetic sensor, comprising 4n magnetoresistive elements (where n denotes a natural number), each of the magnetoresistive elements including a ferromagnetic pinned layer and a ferromagnetic free layer stacked one on top of another with a non-magnetic intermediate layer in between, each of the magnetoresistive elements having a substantially rectangular shape, the magneto resistive elements substantially the same magnetoresistive properties, the ferromagnetic pinned layers having the same direction of magnetization, the 4n magnetoresistive elements constituting first and second element groups each formed of 2n elements, the magnetoresistive elements that constitute each of the element groups being equidistantly disposed as spaced a distance λ away from each other across the front-end and rear-end elements in a direction of a short side of the element and being series-connected in a direction of a long side of the element, the rear-end element of the first element group and the front-end element of the second element group being located as spaced a distance λ/2 away from each other in the direction of the short side of the element, the front-end element of the first element group being connected to an electric power supply while the rear-end element thereof being connected to the front-end element of the second element group, the rear-end element of the second element group being grounded, and an external magnetic field being detected through midpoint electric potential from a connection between the first element group and the second element group, wherein the magnetoresistive element satisfies the inequation, H10–50<H50–90, where H10–50 represents a magnetic field required for a resistance change from ΔR×10% to ΔR×50% with respect to a maximum amount of resistance change ΔR in process of a resistance change occurring according to the external magnetic field parallel to the direction of the short side of the element, and H50–90 represents a magnetic field required for a resistance change from ΔR×50% to ΔR×90%.

2. The magnetic sensor according to claim 1, wherein the magnetoresistive element satisfies the inequation, 1.5<H50–90/H10–50<4.0.

3. The magnetic sensor according to claim 1, wherein the non-magnetic intermediate layer has a locally nonuniform distribution of layer thickness.

4. The magnetic sensor according to claim 1, wherein the ferromagnetic pinned layer and the ferromagnetic free layer have ferromagnetic interlayer interaction with the non-magnetic intermediate layer in between, and the magnitude of the interlayer interaction is locally nonuniform.

5. The magnetic sensor according to claim 1, wherein the direction of magnetization of the ferromagnetic pinned layer is the direction of the short side of the element.

6. The magnetic sensor according to claim 1, wherein the direction of magnetization of the ferromagnetic pinned layer deviates from the direction of the short side of the element within a range of angles of 30 degrees or less.

7. A magnetic encoder, comprising:
a magnetic sensor; and
a magnetic medium having magnetized areas, the directions of magnetizations of which are periodically alternately reversed, and in which the sum of the lengths of a pair of adjacent magnetized areas is equal to 2λ,
wherein the magnetic medium moves relative to the magnetic sensor in a direction of arrangement of the magnetized areas, facing the magnetic sensor with a predetermined gap in between,
the magnetic sensor includes 4n magnetoresistive elements (where n denotes a natural number), each including a ferromagnetic pinned layer and a ferromagnetic free layer stacked one on top of another with a non-magnetic intermediate layer in between, the magnetoresistive elements having a substantially rectangular shape and substantially the same magnetoresistive properties, the ferromagnetic pinned layers having the same direction of magnetization, the 4n magnetoresistive elements constitute first and second element groups each formed of 2n elements, the magnetoresistive elements that constitute each of the element groups are equidistantly disposed as spaced a distance $\lambda$ away from each other across the front-end and rear-end elements in a direction of a short side of the element and are series-connected in a direction of a long side of the element, the rear-end element of the first element group and the front-end element of the second element group are located as spaced a distance $\lambda/2$ away from each other in the direction of the short side of the element, the front-end element of the first element group is connected to an electric power supply, the rear-end element of the first element group is connected to the front-end element of the second element group, the rear-end element of the second element group is grounded, an external magnetic field is detected through midpoint electric potential from a connection between the first element group and the second element group, and the magnetoresistive element satisfies the inequation, $H10-50 < H50-90$, where $H10-50$ represents a magnetic field required for a resistance change from $\Delta R \times 10\%$ to $\Delta R \times 50\%$ with respect to a maximum amount of resistance change $\Delta R$ in process of a resistance change occurring according to the external magnetic field parallel to the direction of the short side of the element, and $H50-90$ represents a magnetic field required for a resistance change from $\Delta R \times 50\%$ to $\Delta R \times 90\%$.

8. The magnetic encoder according to claim 7, wherein the magnetic sensor and the magnetic medium move relative to each other in a magnetized direction of the magnetic medium, and the direction of magnetization of the ferromagnetic pinned layer is the same as the magnetized direction of the magnetic medium.

9. The magnetic encoder according to claim 7, wherein the magnetoresistive element satisfies the inequation, $1.5 < H50-90/H10-50 < 4.0$.

10. The magnetic encoder according to claim 7, wherein the non-magnetic intermediate layer has a locally nonuniform distribution of layer thickness.

11. The magnetic encoder according to claim 7, wherein the ferromagnetic pinned layer and the ferromagnetic free layer have ferromagnetic interlayer interaction with the non-magnetic intermediate layer in between, and the magnitude of the interlayer interaction is locally nonuniform.

12. The magnetic encoder according to claim 7, wherein the direction of magnetization of the ferromagnetic pinned layer is the direction of the short side of the element.

13. The magnetic encoder according to claim 7, wherein the direction of magnetization of the ferromagnetic pinned layer deviates from the direction of the short side of the element within a range of angles of 30 degrees or less.

* * * * *